(12) United States Patent
Tomotani et al.

(10) Patent No.: US 8,942,050 B2
(45) Date of Patent: Jan. 27, 2015

(54) METHOD OF INSPECTING VARIABLE RESISTANCE NONVOLATILE MEMORY DEVICE AND VARIABLE RESISTANCE NONVOLATILE MEMORY DEVICE

(75) Inventors: Hiroshi Tomotani, Osaka (JP); Kazuhiko Shimakawa, Osaka (JP); Ryotaro Azuma, Osaka (JP); Yoshikazu Katoh, Osaka (JP); Yuichiro Ikeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 132 days.

(21) Appl. No.: 13/637,428

(22) PCT Filed: Sep. 7, 2011

(86) PCT No.: PCT/JP2011/005022
§ 371 (c)(1),
(2), (4) Date: Sep. 26, 2012

(87) PCT Pub. No.: WO2012/032775
PCT Pub. Date: Mar. 15, 2012

(65) Prior Publication Data
US 2013/0021838 A1 Jan. 24, 2013

(30) Foreign Application Priority Data
Sep. 7, 2010 (JP) .................................. 2010-200381

(51) Int. Cl.
*G11C 7/06* (2006.01)
*G11C 13/00* (2006.01)
*G11C 29/50* (2006.01)

(52) U.S. Cl.
CPC .......... *G11C 13/0007* (2013.01); *G11C 13/003* (2013.01); *G11C 29/50008* (2013.01); *G11C 13/00* (2013.01); *G11C 2213/15* (2013.01)
USPC ................. 365/189.07; 365/148; 365/189.06; 365/189.09; 365/189.08

(58) Field of Classification Search
CPC ............. G11C 13/0007; G11C 13/003; G11C 29/50008
USPC .................. 365/148, 189.06, 189.07, 189.08, 365/189.09
See application file for complete search history.

(56) References Cited

U.S. PATENT DOCUMENTS 7,916,516 B2   3/2011   Wei et al.
7,986,575 B2   7/2011   Inaba (Continued)

FOREIGN PATENT DOCUMENTS

CN   101553924 A   10/2009
CN   101622673 A   1/2010

(Continued)

OTHER PUBLICATIONS

International Search Report issued Dec. 13, 2011 in corresponding International Application No. PCT/JP2011/005022.

(Continued)

*Primary Examiner* — Viet Q Nguyen
(74) *Attorney, Agent, or Firm* — Wenderoth, Lind & Ponack, L.L.P.

(57) ABSTRACT

A method of inspecting a variable resistance nonvolatile memory device detecting a faulty memory cell of a memory cell array employing a current steering element, and a variable resistance nonvolatile memory device are provided. The method of inspecting a variable resistance nonvolatile memory device having a memory cell array, a memory cell selection circuit, and a read circuit includes: determining that a current steering element has a short-circuit fault when a variable resistance element is in a low resistance state and a current higher than or equal to a predetermined current passes through the current steering element, when the resistance state of the memory cell is read using a second voltage; and determining whether the variable resistance element is in the low or high resistance state, when the resistance state of the memory cell is read using a first voltage.

17 Claims, 19 Drawing Sheets

(56) References Cited

U.S. PATENT DOCUMENTS

| | | |
|---|---|---|
| 8,004,873 B2 | 8/2011 | Toda |
| 8,023,312 B2 | 9/2011 | Yamazaki et al. |
| 8,351,244 B2 * | 1/2013 | Okada et al. .................. 365/148 |
| 8,482,958 B2 * | 7/2013 | Hayakawa et al. ............ 365/148 |
| 8,699,261 B2 * | 4/2014 | Tomotani et al. ............. 365/148 |
| 2009/0052225 A1 | 2/2009 | Morimoto |
| 2009/0213639 A1 | 8/2009 | Toda |
| 2009/0273964 A1 | 11/2009 | Yamazaki et al. |
| 2010/0008125 A1 | 1/2010 | Inaba |
| 2010/0110766 A1 | 5/2010 | Wei et al. |
| 2011/0063887 A1 | 3/2011 | Kanda |
| 2011/0284816 A1 | 11/2011 | Fujii et al. |

FOREIGN PATENT DOCUMENTS

| | | |
|---|---|---|
| JP | 57-210385 | 12/1982 |
| JP | 2002-56666 | 2/2002 |
| JP | 2006-203098 | 8/2006 |
| JP | 2009-199695 | 9/2009 |
| JP | 2010-20811 | 1/2010 |
| JP | 2011-65717 | 3/2011 |
| WO | 2010/087211 | 8/2010 |

OTHER PUBLICATIONS

Reply to Written Opinion of International Searching Authority issued Dec. 13, 2011 in International Application No. PCT/JP2011/005022 (with partial English translation).

Office Action issued Aug. 22, 2014 in corresponding Chinese Application No. 201180017639.5 (with partial English translation).

* cited by examiner

Memory cell characteristics
(synthesized characteristics of diode
and variable resistance layer)

Memory cell characteristics
(synthesized characteristics of diode
and variable resistance layer)

FIG. 9

| | | | Regular read mode | Cell characteristic determination mode |
|---|---|---|---|---|
| Bit-line voltage switching circuit | | SW1 | ON | OFF |
| | | SW2 | OFF | ON |
| Clamp voltage, Bit-line voltage | | Node CLMP | Vre + Vtn + VF | Vre + Vtn |
| | | Selected bit line BL | ≤ Vre + VF | ≤ Vre |
| Output terminal SAOUT of read circuit | Normal cell | Variable resistance element Low resistance state | "L" is outputted | "H" is outputted |
| | | Variable resistance element High resistance state | "H" is outputted | "H" is outputted |
| | Cell having faulty current control element | Variable resistance element Low resistance state | "L" is outputted | "L" is outputted (faulty state is detected) |
| | | Variable resistance element High resistance state | "L" or "H" is outputted | "L" or "H" is outputted (faulty state is not detected) |

METHOD OF INSPECTING VARIABLE RESISTANCE NONVOLATILE MEMORY DEVICE AND VARIABLE RESISTANCE NONVOLATILE MEMORY DEVICE

TECHNICAL FIELD

The present invention relates to a method of inspecting, for a fault, a memory cell including a so-called variable resistance nonvolatile memory element (a variable resistance element) and a current steering element, and to a variable resistance nonvolatile memory device having such an inspecting function.

BACKGROUND ART

In recent years, with the advances in semiconductor miniaturization technologies, densities and capacities of memory devices (memories) have been significantly increased. The field of nonvolatile memory devices has made remarkable technological developments in flash memories and electrically erasable and programmable ROMs (EEPROMs), and thus begun to achieve cost reduction. In particular, the cost of flash memories has been reduced year after year. Under these circumstances, a system employing a flash memory has been used in many fields from a field of program storage devices to be built into home electrical appliances to a field of data storage devices for storing data including music, images, and video. With a further cost reduction, nonvolatile memory devices can be expected to be applied in various fields. The miniaturization and cost reduction of conventional nonvolatile memory devices have been implemented by the advances in the technologies for manufacturing flash memories. In recent years, however, the miniaturization of flash memories employing floating gates is said to be approaching the limit. With this being the situation, a new nonvolatile memory device has received attention for further reducing a cell area size and a cost.

Research and development have been promoted for a nonvolatile memory device, as the new nonvolatile memory device, having a memory cell including a variable resistance element. Here, the variable resistance element reversibly changes a resistance value in response to an electrical signal, and can store data corresponding to this resistance value in a nonvolatile manner.

As a nonvolatile memory device employing a variable resistance element, a 1T1R nonvolatile memory device is generally known. This 1T1R nonvolatile memory device has a structure where so-called 1T1R memory cells are arranged in an array of a matrix. Each of the 1T1R memory cells includes a metal oxide semiconductor (MOS) transistor and a variable resistance element that are connected in series at a position near a cross point of a bit line and a word line that are arranged to cross each other. In the 1T1R memory cell, one terminal of the two-terminal variable resistance element is connected to the bit line or a source line, and the other terminal is connected to a drain terminal or a source terminal of the transistor. A gate terminal of the transistor is connected to the word line. The source line is set in parallel to the bit line or the word line.

Moreover, as another example, a cross point nonvolatile memory device is also generally known (see Patent Literatures 1 and 2, for instance). This cross point nonvolatile memory device has a memory cell structure where so-called 1D1R memory cells are arranged in an array of a matrix. Each of the 1D1R memory cells includes a diode serving as a current steering element and a variable resistance element that are connected in series at a cross point of a bit line and a word line that are arranged to cross each other.

Patent Literature 1 discloses a 1D1R nonvolatile memory device that employs, as a memory cell, a variable resistance element having a characteristic of changing resistance bidirectionally. FIG. 17 is a diagram showing a configuration of a conventional nonvolatile memory cell. FIG. 17 shows a memory cell array having a cross point structure where a memory cell 1280 is placed at a cross point of a bit line 1210 and a word line 1220. The memory cell 1280 includes a variable resistance element 1260 and a nonlinear element 1270 that are connected in series. The variable resistance element 1260 includes a variable resistor 1230 sandwiched between an upper electrode 1240 and a lower electrode 1250. Here, the variable resistance element 1260 has a characteristic of reversibly changing a resistance value between a low resistance state and a high resistance state bidirectionally, in response to a polarity of the applied voltage. Moreover, the nonlinear element 1270 is configured with, for example, a varistor for the purpose of reducing a leakage current, as it is called, that passes through a nonselected cell. In the memory cell array having the cross point structure, the memory cells can be arranged according to a wiring pitch. Furthermore, such memory cell arrays can be stacked three-dimensionally, thereby increasing in capacity.

Patent Literature 2 discloses a method of detecting a fault in a nonlinear element included in a 1D1R memory cell that is configured with a unidirectional variable resistance element. FIG. 18 is a diagram showing a configuration of a conventional nonvolatile memory cell array. In FIG. 18, a memory cell is placed at each cross point of bit lines BL1, BL2, and BL3 and word lines WL1, WL2, and WL3. The memory cell includes a unidirectional variable resistance element and a unidirectional diode element that are connected in series. The unidirectional diode has an anode and a cathode. With the application of a potential "Vdd" to all the bit lines and the application of a potential "Vss" to all the word lines, no current passes through a normal diode element in a reverse biased state. However, a DC current passes through a faulty diode element even in the reverse biased state, and the bit line on which the faulty diode element is located decreases in potential from the potential Vdd. Patent Literature 2 discloses a method of detecting a bit line having such a faulty diode element as a faulty bit line. FIG. 19 is a diagram showing a model of a memory cell employing a conventional unidirectional diode. As shown in FIG. 19, a fault detection circuit 2053 described in Patent Literature 2 includes a bit-line power supply circuit 2054, a latch circuit 2531, and a switch circuit 2055, and is connected to a bit line connected to a bit line selection circuit 2024. A standby unit 2052 of the fault detection circuit 2053 detects a faulty bit line connected to a faulty diode element.

CITATION LIST

Patent Literature

[PTL 1]
Japanese Unexamined Patent Application Publication No. 2006-203098 (FIG. 2)
[PTL 2]
Japanese Unexamined Patent Application Publication No. 2009-199695 (FIG. 6)

SUMMARY OF INVENTION

Technical Problem

However, when a memory cell array is increased in capacity, the number of memory cell faults tends to increase. When a problem of a leakage current occurs to a diode element used as a current steering element in a conventional 1D1R cross point array structure, normal reading cannot be performed when a faulty memory cell having this leakage current problem is selected. Moreover, even when a normal memory cell is selected, the influence of the faulty memory cell cannot be avoided. That is, even when only one memory cell is faulty, the memory cells located on the bit line or the word line having this faulty memory cell are misidentified as having faults and thus the address of the faulty memory cell cannot be specified. On this account, it is extremely difficult to analyze a cause of the fault by a physics analysis, a FIB analysis, or the like.

Patent Literature 2 discloses the method of detecting the faulty bit line of the unidirectional diode element having the anode and the cathode. To be more specific, Patent Literature 2 describes the method of detecting the faulty bit line having the leakage current problem by using the facts that a current flows when a forward voltage is applied and that no current flows when a reverse voltage is applied. When all the memory cells are normal, no current flows when: all the bit lines are set at a potential Vdd; all the word lines are set at a potential Vss; and the diode elements are set in the reverse biased state. However, when a faulty memory cell having a leakage current problem is present, a leakage current flows from the bit line having this faulty memory cell to the word lines. By determining this leakage current, the faulty bit line having the leakage current problem can be detected.

However, in the case of a memory cell where a bidirectional current steering element (such as a metal-semiconductor-metal (MSM) diode or a metal-insulator-metal (MIM) diode) is employed, a current flows when either one of the forward voltage and the reverse voltage is applied. On this account, the faulty memory cell having the leakage current problem cannot be detected. Moreover, as shown in FIG. 19, the fault detection circuit 2053 described in Patent Literature 2 is connected only to the bit line. Therefore, although detecting the faulty bit line having the leakage current problem, the fault detection circuit 2053 cannot detect which one of the memory cells that is connected to this faulty bit line causes the fault.

In order to solve the stated problems, the present invention has an object to provide: a method of inspecting a variable resistance nonvolatile memory device capable of detecting a faulty memory cell of a memory cell array that employs a current steering element; and a variable resistance nonvolatile memory device.

Solution to Problem

In order to achieve the aforementioned object, the method of inspecting the variable resistance nonvolatile memory device in an aspect according to the present invention is a method of inspecting a variable resistance nonvolatile memory device, the variable resistance nonvolatile memory device including: a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing at least between a low resistance state and a high resistance state, and the current steering element carrying a current from which the current steering element is assumed to be conducting as a result of an application of a voltage exceeding a predetermined threshold voltage; a memory cell selection circuit that selects one of the memory cells by selecting at least one of the word lines and at least one of the bit lines; and a read circuit that reads a resistance state of the selected memory cell by performing voltage application on the selected memory cell so that a first voltage higher than the threshold voltage and a second voltage lower than the threshold voltage are applied to the current steering element of the selected memory cell, and the method including: determining that the current steering element has a short-circuit fault in the case where a value of a current passing through the current steering element is higher than or equal to a predetermined value, when the resistance state of the memory cell is read by the application of the second voltage; and determining whether the variable resistance element is in the low resistance state or the high resistance state, when the resistance state of the memory cell is read by the application of the first voltage.

This configuration can detect, in the memory cell array having a cross point array structure where a bidirectional current steering element is used, a faulty memory cell that includes a current steering element having a faulty characteristic in a threshold voltage, that is, a memory cell that includes a current steering element having a short-circuit fault. As a result, a highly-reliable memory cell array can be implemented.

Moreover, it is preferable that the second voltage is lower than the first voltage by the threshold voltage.

With this configuration, the first voltage and the second voltage can be easily set by, for example, the current steering element.

Furthermore, it is preferable that the method further includes writing the low resistance state to the memory cell, before the determining that the current steering element has the short-circuit fault, wherein, when the current having the value higher than or equal to the predetermined value does not pass through the current steering element, the current steering element is determined to be normal.

With this configuration, even when the current steering element of the selected memory cell is in the high resistance state, whether the current steering element is normal or abnormal can be accurately determined by previously setting the current steering element in the low resistance state.

Moreover, it is preferable that, after the resistance state of the memory cell is read by the application of the second voltage, the resistance state of the memory cell is read by the application of the first voltage.

With this configuration, when the determination is made as to whether the current steering element of the selected memory cell is normal or abnormal, the first voltage can prevent the current steering element from changing to the high resistance state. Thus, the determination as to whether the current steering element is normal or abnormal can be accurately made.

Furthermore, it is preferable that the predetermined value is a maximum value of a current passing through the current steering element when (i) the threshold voltage is applied to the current steering element that is normal and in the low resistance state and (ii) the current steering element is assumed to be in an OFF state.

With this configuration, when the determination is made as to whether the current steering element of the selected memory cell is normal or abnormal, this determination can be accurately made using, as a reference current, the maximum value of the current that passes through the current steering element when: the threshold voltage is applied to a normal current steering element in the low resistance state; and the current steering element can be assumed to be in the OFF state (this reference current is referred to as the maximum OFF current).

Moreover, in order to achieve the aforementioned object, the variable resistance nonvolatile memory device in an aspect according to the present invention is a variable resistance nonvolatile memory device including: a plurality of word lines arranged in parallel to each other in a first plane; a plurality of bit lines that are arranged in parallel to each other in a second plane parallel to the first plane, and three-dimensionally cross the word lines; a memory cell array having a plurality of memory cells each including a variable resistance element and a current steering element that are connected in series, each of the memory cells being located at a three-dimensional cross point of one of the word lines and one of the bit lines, the variable resistance element changing at least between a low resistance state and a high resistance state, and the current steering element carrying a current from which the current steering element is assumed to be conducting as a result of an application of a voltage exceeding a predetermined threshold voltage; a memory cell selection circuit that selects one of the memory cells by selecting at least one of the word lines and at least one of the bit lines; and a read circuit that reads a resistance state of the selected memory cell, wherein the read circuit includes: a bit-line control voltage generation circuit that (i) generates a first voltage higher than the threshold voltage and a second voltage lower than the threshold voltage and (ii) outputs the first voltage and the second voltage from a first output terminal and a second output terminal, respectively; a bit-line voltage switching circuit that is connected to the bit-line control voltage generation circuit and switches between the first voltage and the second voltage to provide a corresponding one of the first voltage and the second voltage; a bit-line voltage steering circuit that has (i) an output terminal connected to the memory cell selection circuit and (ii) a control terminal connected to the bit-line voltage switching circuit; and a detection circuit that detects a current passing through the selected memory cell via the selected word line and the selected bit line as a result of an application of a voltage to the selected bit line, the voltage being determined according to a voltage to be applied to the control terminal of the bit-line voltage steering circuit, wherein, when the resistance state of the memory cell is read by the application of the first voltage, the detection circuit provides (i) a first logic output when the selected memory cell is in the low resistance state and (ii) a second logic output when the selected memory cell is in the high resistance state, and when the resistance state of the memory cell is read by the application of the second voltage and the current steering element of the selected memory cell has a short-circuit fault, the detection circuit provides (i) the first logic output when the variable resistance element is in the low resistance state, and (ii) one of the first logic output and the second logic output when the variable resistance element is in the high resistance state.

This configuration can detect, in the memory cell array having a cross point array structure where a bidirectional current steering element is used, a faulty memory cell that includes a current steering element having a faulty characteristic in a threshold voltage, that is, a memory cell that includes a current steering element having a short-circuit fault. As a result, a highly-reliable memory cell array can be implemented.

Furthermore, it is preferable that the second voltage is lower than the first voltage by the threshold voltage.

With this configuration, the first voltage and the second voltage can be easily set by, for example, the current steering element.

Moreover, it is preferable that the second voltage is generated as a partial voltage of the first voltage and is higher than a ground potential used as a reference potential, and that the current steering element is connected between the first output terminal and the second output terminal of the bit-line control voltage generation circuit.

Furthermore, it is preferable that the second voltage is generated as a partial voltage of the first voltage and is higher than a ground potential used as a reference potential, that a fixed resistance element is connected between the first output terminal and the second output terminal of the bit-line control voltage generation circuit, and that a resistance value of the fixed resistance element is set so that a potential difference between the first voltage and the second voltage is equal to the threshold voltage.

Moreover, it is preferable that the second voltage is generated as a partial voltage of the first voltage and is higher than a ground potential used as a reference potential, and that an NMOS transistor and a resistance element are connected in series between the ground potential and the second output terminal of the bit-line control voltage generation circuit, the NMOS transistor having a drain terminal and a gate terminal connected to each other.

Furthermore, it is preferable that the resistance element is formed by a variable resistance element having a same configuration as the variable resistance element included in the memory cell, and is set to one of a low resistance state and a high resistance state.

Moreover, it is preferable that the resistance element is formed by a fixed resistance element, and that a resistance value of the fixed resistance element is set to be between a resistance value of the variable resistance element in the low resistance state and a resistance value of the variable resistance element in the high resistance state.

Furthermore, it is preferable that the second voltage is generated as a partial voltage of the first voltage and is higher than a ground potential used as a reference potential, that a fixed resistance element is connected between the ground potential and the second output terminal of the bit-line control voltage generation circuit, and that a resistance value of the fixed resistance element is set so that a potential difference between the first voltage and the second voltage is equal to the threshold voltage.

Moreover, it is preferable that the second voltage is generated as a partial voltage of the first voltage and is higher than a ground potential used as a reference potential, and that a current steering element having a same configuration as the current steering element included in the memory cell and a variable resistance element having a same configuration as the variable resistance element included in the memory cell are connected in series between the first output terminal and the second output terminal of the bit-line control voltage generation circuit.

With this configuration, the memory cell that includes the current steering element having a short-circuit fault can be detected more accurately.

Furthermore, it is preferable that the bit-line control voltage generation circuit includes a first voltage source generating the first voltage and a second voltage source generating the second voltage.

With this configuration, the first voltage and the second voltage can be set directly by the first voltage source and the second voltage source, respectively.

Moreover, it is preferable that the read circuit further includes a voltage detection circuit that detects a voltage of the selected bit line.

With this configuration, whether the current steering element is normal or abnormal can be determined at high speed. Furthermore, when the current steering element has a short-circuit fault, this configuration can implement current steering to prevent a high current from passing through the variable resistance element.

Advantageous Effects of Invention

The present invention can provide: a method of inspecting a variable resistance nonvolatile memory device capable of detecting a faulty memory cell of a memory cell array that employs a current steering element; and a variable resistance nonvolatile memory device.

BRIEF DESCRIPTION OF DRAWINGS

FIG. 9 is a diagram showing a mode-specific truth table.

DESCRIPTION OF EMBODIMENTS

The following is a description of Embodiments of a variable resistance nonvolatile memory device (may be simply referred to as the "nonvolatile memory device" hereafter) according to the present invention, with reference to the drawings. Although the present invention is described by way of Embodiments with reference to the drawings, it is to be noted that Embodiments below describe only examples and are not intended to limit the present invention.

Embodiment 1

Memory Cell

Figure 1:
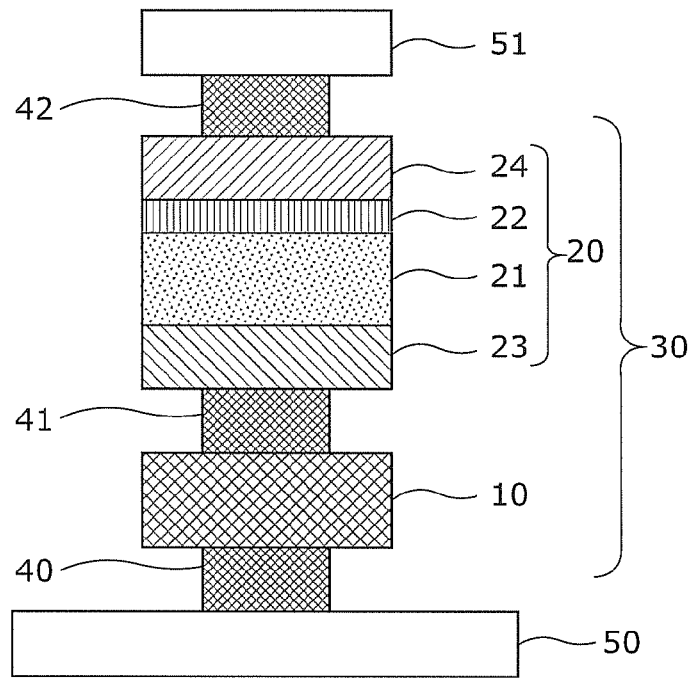
FIG. 1 is a diagram showing an example of a configuration of a memory cell in Embodiment 1.

FIG. 1 is a diagram showing an example of a configuration of a memory cell in Embodiment 1 according to the present invention. A memory cell 30 shown in FIG. 1 includes a current steering element 10 and a variable resistance element 20.

In FIG. 1, the current steering element 10 is connected to the variable resistance element 20 via a contact 41, and the current steering element 10 and the variable resistance element 20 form the one-bit 1D1R memory cell 30. One terminal of the memory cell 30 is connected to a lower line 50 via a contact 40, and the other terminal of the memory cell 30 is connected to an upper line 51 via a contact 42. The current steering element 10 and the variable resistance element 20 are connected to each other via the contact 41.

As can be understood from that the current steering element 10 is typified by a diode or the like, a voltage applied to both terminals of the current steering element 10 and a current flowing between the terminals of the current steering element 10 show nonlinear characteristics. The current steering element 10 is a bidirectional diode that changes a direction of current flow according to a polarity of the applied voltage. To be more specific, the current steering element 10 has a threshold voltage for each of positive and negative applied voltage regions. When an absolute value of the voltage to be applied to the both terminals of the current steering element 10 is lower than or equal to the threshold voltage ("VF"), an absolute value of the current to flow is such that the current hardly flows. When the absolute value of the voltage to be applied exceeds the VF, the absolute value of the current to flow nonlinearly increases. Moreover, according to a polarity of the applied voltage, the direction in which the current flows changes. Then, according to the absolute value of the applied voltage, the absolute value of the current to flow changes.

Furthermore, the variable resistance element 20 includes a lower electrode 23, a first variable resistance layer 21, a second variable resistance layer, and an upper electrode 24. The first variable resistance layer 21 comprises, for example, an oxygen-deficient tantalum oxide ($TaO_x$ where $0<x<2.5$). The second variable resistance layer 22 is formed on the first variable resistance layer 21 and comprises a tantalum oxide ($TaO_y$ where $x<y$) that has a higher oxygen concentration than the first variable resistance layer 21. The variable resistance element 20 has a sandwich structure where the first variable resistance layer 21 and the second variable resistance layer 22 are sandwiched between the lower electrode 23 and the upper electrode 24.

Here, the oxygen-deficient oxide refers to an oxide that is deficient in oxygen as compared with a stoichiometric composition. Oxide examples of tantalum which is a transition metal include $Ta_2O_5$ having a stoichiometric composition. This $Ta_2O_5$ includes oxygen 2.5 times greater than tantalum, that is, about 71.4% when expressed by an oxygen content atomic percentage. When the oxide having a lower oxygen content atomic percentage is expressed as $TaO_x$, a tantalum oxide having a composition that satisfies $0<x<2.5$ is considered to be an oxygen-deficient oxide. In the variable resistance element 20, a resistance value of the second variable resistance layer 22 changes according to the polarity of a voltage to be applied between the lower electrode 23 and the upper electrode 24. Then, the variable resistance element 20 has a nonvolatile characteristic of holding this state. To be more specific, by applying, for example, a first positive variable resistance voltage to the upper electrode 24 with respect to the lower electrode 23, the second variable resistance layer 22 can be set in a high resistance state. Moreover, by applying a second variable resistance voltage to the lower electrode 23 with respect to the upper electrode 24, the second variable resistance layer 22 can be set in a lower resistance state.

The upper electrode 24 comprises a metal (a precious metal such as platinum (Pt) or iridium (Ir)) having a standard electrode potential higher than a standard electrode potential of the metal (tantalum in the present example) included in the first variable resistance layer 21 and the second variable resistance layer 22. The lower electrode 23 comprises an electrode material including, as a main component, a material (such as tantalum nitride (TaN)) having a standard electrode potential lower than a standard electrode potential of the upper electrode 24. The lower electrode 23 and the upper electrode 24 comprise the respective different materials each including a different element. These materials may be any materials as long as a standard electrode potential "V1" of the lower electrode 23, a standard electrode potential "V2" of the upper electrode 24, and a standard electrode potential "Vt" of the metal included in the second variable resistance layer 22 satisfy Vt<V2 and V1<V2. More specifically, when the tantalum oxide is used for the first variable resistance layer and the second variable resistance layer, it is preferable for the material used for the lower electrode 23 to be selected from among TaN, tungsten (W), nickel (Ni), tantalum (Ta), titanium (Ti), and aluminum (Al) and for the material used for the upper electrode 24 to be selected from among Pt, Ir, palladium (Pd), silver (Ag), copper (Cu), and gold (Au).

It should be noted that the connection relationship between the current steering element 10 and the variable resistance element 20 shown in FIG. 1 may be turned upside down. Moreover, note that the connection relationship between the first variable resistance layer 21 and the second variable resistance layer 22 may be turned upside down, and that the connection relationship between the lower electrode 23 and the upper electrode 24 may be turned upside down.

Figure 2:
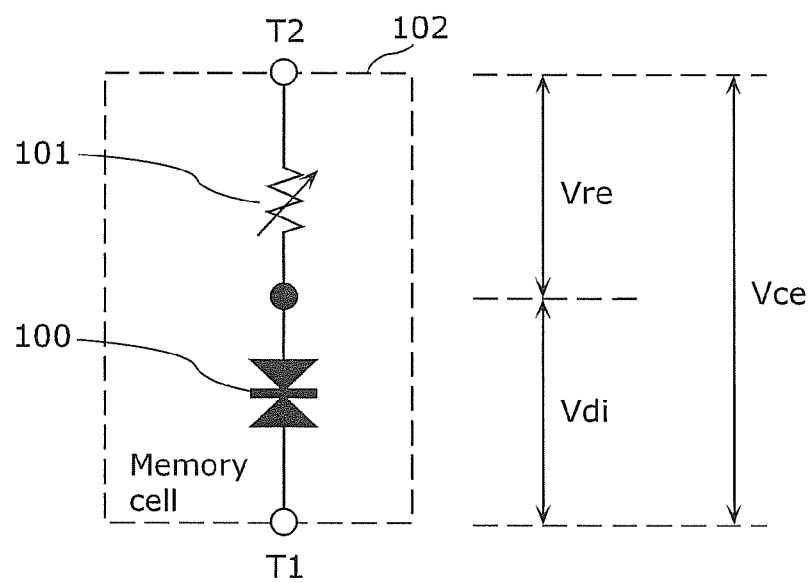
FIG. 2 is an equivalent circuit diagram of the memory cell.

FIG. 2 is an equivalent circuit diagram of the memory cell 30 shown in FIG. 1 in Embodiment 1. FIG. 2 shows an equivalent circuit diagram of a memory cell 102 where a current steering element 100 and a variable resistance element 101 are connected in series. It should be noted that one terminal T1 of the memory cell 102 may be connected to the lower line 50 and that the other terminal T2 may be connected to the upper line 51. Moreover, note that the one terminal T2 of the memory cell may be connected to the lower line 50 and the other terminal T1 may be connected to the upper line 51.

In FIG. 2, when a voltage "Vce" is applied between the two terminals T1 and T2 of the memory cell 102, the voltage is divided into respective voltages "Vdi" and "Vre" to be applied to both terminals of the current steering element 100 and both terminals of the variable resistance element 101, according to a difference in impedance between the current steering element 100 and the variable resistance element 101. As a result, a memory cell current passes through the memory cell 102.

Figure 3:
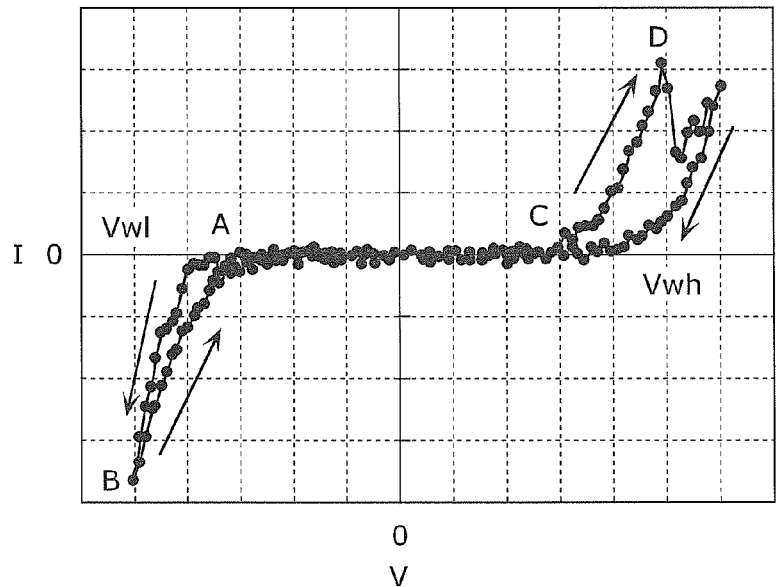
FIG. 3 is a diagram showing voltage-current characteristics of the memory cell.

FIG. 3 is a diagram showing voltage-current characteristics of the memory cell 30 in Embodiment 1. Suppose that, in the memory cell 30 having the configuration as shown in FIG. 1, when the upper line 51 is at a higher voltage than the lower line 50, this voltage is a positive-polarity voltage. Also suppose that the direction in which a current flows from the upper line 51 to the lower line 50 is a positive current direction. Here, FIG. 3 shows actual measurement values representing a relationship between voltage and current when the voltage is applied to the both terminals of the memory cell 30.

In order to apply a voltage to the memory cell 30, when a negative polarity voltage is applied to the upper line 51 so that the lower line 50 is at a higher potential than the upper line 51, a current starts flowing from a point A and the variable resistance element 20 starts changing from a high resistance state to a low resistance state. Moreover, when the voltage up to a point B is applied, an absolute value of the current increases with an absolute value of the applied voltage and the resistance value gradually decreases. More specifically, the resistance value of the low resistance state can be set according to a voltage (or a current) to be applied to the memory cell 30.

On the other hand, in order to apply a voltage to the memory cell 30, when a positive polarity voltage is applied to the upper line 51 so that the upper line 51 is at a higher potential than the lower line 50, a current starts flowing from a point C and the variable resistance element 20 starts changing from the high resistance state to the low resistance state. Then, when reaching a point D that is approximately symmetrical to the aforementioned voltage at which the variable resistance element 20 changes to the low resistance state, the variable resistance element 20 starts changing from the low resistance state to the high resistance state. Moreover, when the voltage increases, the current increases with the applied voltage. After this, when the voltage decreases, the current decreases as compared with the case where the applied voltage increases. From this, it can be understood that the variable resistance element 20 changes to the high resistance state.

To be more specific, the actual measurement data shown in FIG. 3 indicates a bidirectional variable resistance characteristic. That is, when the voltage of the lower line 50 becomes an LR write voltage "Vwl" (a voltage at the point B) with respect to the voltage of the upper line 51 as a reference voltage, the memory cell 30 having the configuration shown in FIG. 1 changes to the low resistance state. Also, when the voltage of the upper line 51 becomes higher than or equal to an HR write voltage "Vwh" (a voltage at the point D or higher) with respect to the voltage of the lower line 50 as a reference voltage, the memory cell 30 changes to the high resistance state. Moreover, the actual measurement data shown in FIG. 3 indicates that the applied voltage in the low resistance state (i.e., at the point B) and the voltage at which the low resistance state starts changing to the high resistance state (i.e., at the point D) are approximately symmetrical in the voltage-current relationship with respect to an origin point of the actual measurement data shown in FIG. 3.

Even when the voltage is applied to the memory cell 30, a voltage region between the point A and the point C includes a region where a current does not flow remarkably. This is because the current steering element 10 of the memory cell 30 is in an OFF state and thus the current hardly passes through the memory cell 30. More specifically, the current passing through the current steering element 10 of the memory cell 30 by the application of voltage has a nonlinear characteristic. On this account, when the absolute value of the voltage applied to the current steering element 10 is lower than or equal to the threshold voltage (VF), the current hardly flows. From this, the current steering element 10 is considered to be in the OFF state and, therefore, the current hardly passes through the memory cell 30. Here, the threshold voltage (VF) refers to a maximum voltage to be applied to the current steering element 10 when only a current such that the current steering element 10 is considered to be in the OFF state flows (this current is referred to as the maximum OFF current). Moreover, the maximum OFF current of the current steering element 10 is a current lower than a maximum current IHR flowing when at least the variable resistance element 20 of the memory cell 30 is in the high resistance state.

Each of the point A and the point C corresponds to a total voltage of the threshold voltage (VF) of the current steering element 10 and the voltage applied to the variable resistance element 20. In a memory array where a plurality of memory cells 30 are arranged in an array (namely, a cross point array), a voltage higher than or equal to the voltage at the point A or the point C is applied to the selected memory cell 30 and a voltage within the voltage region between the point A and the point C is applied to a nonselected memory cell. As a result of this, a leakage current is prevented from flowing to the nonselected cell and the current passes through the selected memory cell 30.

Figure 4:
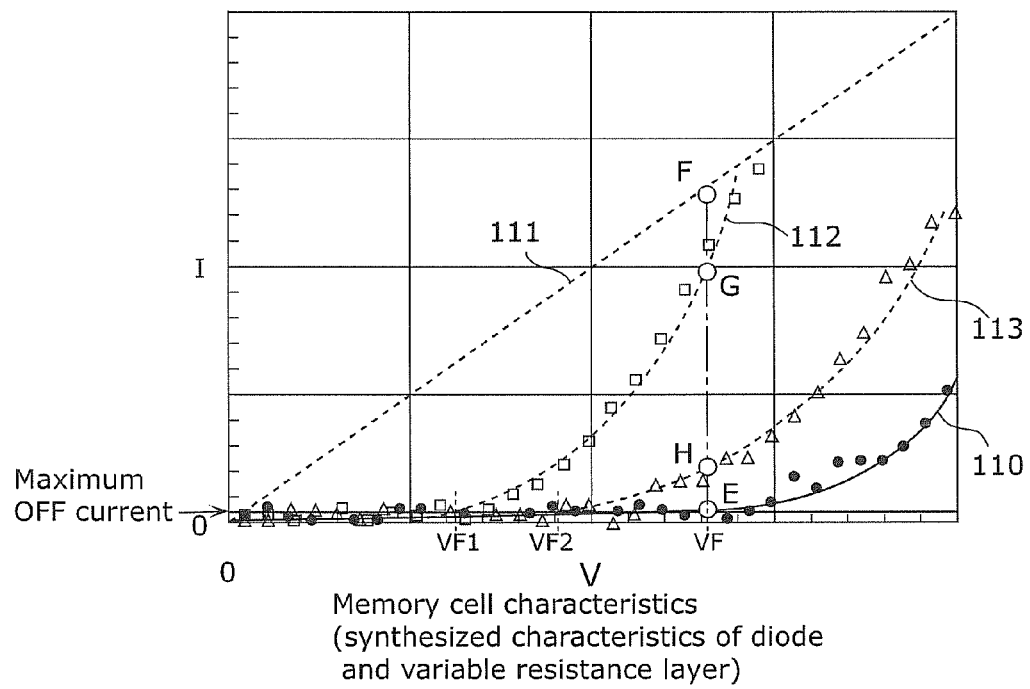
FIG. 4 is a diagram showing voltage-current characteristics of a normal memory cell and a faulty memory cell.

FIG. 4 is a diagram showing voltage-current characteristics of a memory cell 30 having a normal characteristic and a memory cell 30 having a faulty characteristic (a short-circuit fault) in Embodiment 1. Suppose that, in the memory cell 30 selected by the lower line 50 and the upper line 51 shown in FIG. 1, when the upper line 51 is at a higher voltage than the lower line 50, this voltage is a positive-polarity voltage. As indicated by a characteristic 110 shown by a solid line, the positive voltage and current applied to the memory cell 30 having the normal characteristic show a nonlinear characteristic where the threshold voltage is VF. On the other hand, in the memory cell 30 having the faulty characteristic where the current steering element 10 is faulty, the characteristic of the variable resistance element 20 is dominant. Therefore, the memory cell 30 having the faulty characteristic shows a linear characteristic as indicated by a characteristic 111 shown by a dashed line.

When the threshold voltage VF of the current steering element 10 is applied to both terminals of the memory cell 30 having the normal characteristic, the voltage Vdi applied to the both terminals of the current steering element 10 is lower than or equal to the threshold voltage VF as indicated by the characteristic 110. Thus, the current steering element 10 enters the OFF state and a current lower than or equal to the maximum OFF current passes through the memory cell 30, as indicated by a point E. On the other hand, when the threshold voltage VF is applied to both terminals of the memory cell 30 having the faulty characteristic where the current steering element 10 is faulty, the current steering element 10 becomes shorted because of the fault. Thus, as indicated by the characteristic 111, a current indicated by a point F flows, meaning that a current higher than the maximum OFF current flows.

To be more specific, suppose that the memory cell voltage Vce is applied to the both terminals of the memory cell 30 selected by the lower line 50 and the upper line 51 so that the voltage lower than or equal to the threshold voltage VF where the current steering element 10 enters the OFF state is applied to the current steering element 10. Here, in the case of the normal characteristic as shown by the characteristic 110, only a slight current as indicated by the point E (a current lower than or equal to the maximum OFF current) flows. On the other hand, in the case of the faulty characteristic as shown by the characteristic 111, a current higher than the maximum OFF current as indicated by the point F flows. Hence, by detecting this current value, the characteristic of the memory cell 30 can be determined.

The case of the characteristic 111 where the current steering element 10 is completely faulty and shorted has been described thus far. Note that the detection can be executed in the same way in the case of a faulty characteristic where the threshold voltage VF of the current steering element 10 is low. A characteristic 112 and a characteristic 113 shown in FIG. 4 correspond to the voltage-current characteristics of the memory cell in the cases where the threshold voltage VF of the current steering element 10 is VF1 and VF2 that are lower than the threshold voltage VF of the normal memory cell 30. In either case, when the voltage VF is applied to the both terminals of the memory cell 30, a current higher than the maximum OFF current passes through the memory cell 30 as indicated by a point G and a point H since the current steering element 10 has the faulty characteristic. By detecting this current, the characteristic of the memory cell 30 can be determined.

When the voltage VF2 is applied to the both terminals of the memory cell 30, only a current lower than or equal to the maximum OFF current passes through the memory cell 30 having the characteristic 110 or 113. However, a current higher than the maximum OFF current passes through the memory cell 30 having the characteristic 111 or 112. To be more specific, by changing the value of the voltage to be applied to the both terminals of the memory cell 30, the characteristic of the memory cells 30 that is a detection target can be evaluated.

[Variable Resistance Nonvolatile Memory Device]

Figure 5:
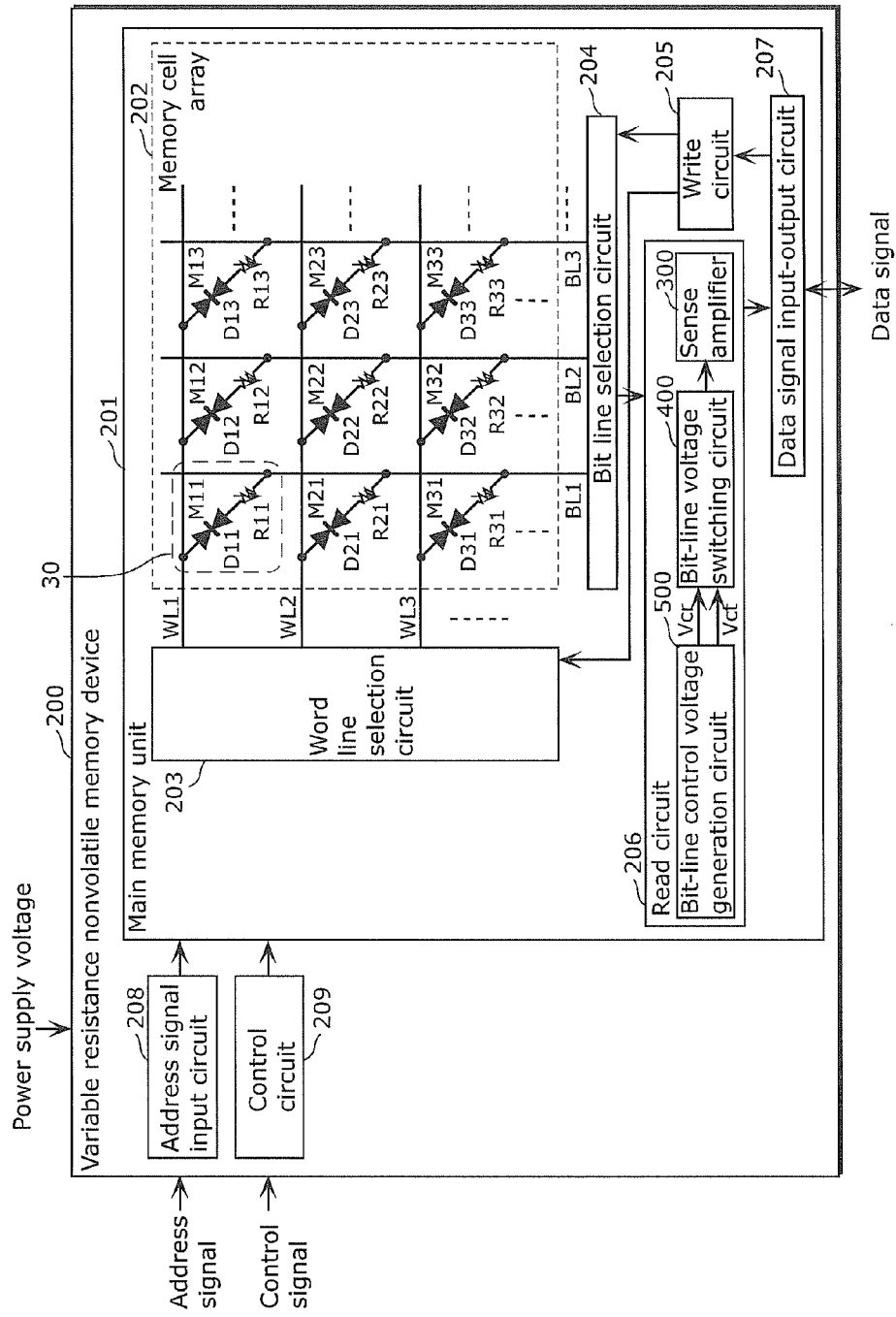
FIG. 5 is a diagram showing a configuration of a variable resistance nonvolatile memory device.

FIG. 5 is a diagram showing a configuration of a variable resistance nonvolatile memory device 200 in Embodiment 1. As shown in FIG. 5, the variable resistance nonvolatile memory device 200 in Embodiment 1 includes a main memory unit 201 formed on a substrate. The main memory unit 201 includes a memory cell array 202, a word line selection circuit 203, a bit line selection circuit 204, a write circuit 205 for writing data, and a read circuit for reading data.

The read circuit 206 includes a sense amplifier 300, a bit-line voltage switching circuit 400, and a bit-line control voltage generation circuit 500 that generates at least two kinds of clamp voltages. The read circuit 206 is connected to a data signal input-output circuit 207 that receives and outputs a data signal from and to an external source.

Moreover, the variable resistance nonvolatile memory device 200 includes: an address signal input circuit 208 that receives an address signal from outside the variable resistance nonvolatile memory device 200; and a control circuit 209 that receives a control signal from outside the variable resistance nonvolatile memory device 200.

The memory cell array 202 includes a plurality of word lines WL1, WL2, WL3, ..., and a plurality of bit lines BL1, BL2, BL3, ... formed on the substrate. Here, the word lines and the bit lines are arranged so as to cross each other. As shown in FIG. 5, the plurality of word lines WL1, WL2, WL3, ... are arranged in parallel to each other in one plane (a first plane) that is parallel to a main plane of the substrate. Similarly, the plurality of bit lines BL1, BL2, BL3, ... are arranged in parallel to each other in one plane (a second plane parallel to the first plane) that is parallel to the first plane. Moreover, the first plane and the second plane are parallel to each other, and the word lines WL1, WL2, WL3, ..., and the bit lines BL1, BL2, BL3, ... are arranged so as to three-dimensionally cross each other.

At the three-dimensional cross points of the word lines WL1, WL2, WL3, ..., and the bit lines BL1, BL2, BL3, ..., there are provided current steering elements D11, D12, D13, D21, D22, D23, D31, D32, D33, ... (referred to as "the current steering elements D11, D12, D13, ..." hereafter) and variable resistance elements R11, R12, R13, R21, R22, R23, R31, R32, R33, ... (referred to as "the variable resistance elements R11, R12, R13, ..." hereafter) connected in series with the current steering elements D11, D12, D13, D21, D22, D23, D31, D32, D33, . . . . Each pair of the current steering elements D11, D12, D13, D21, D22, D23, D31, D32, D33, . . . and the variable resistance elements R11, R12, R13, R21, R22, R23, R31, R32, R33, . . . connected in series with each other form a corresponding one of memory cells M11, M12, M13, M21, M22, M23, M31, M32, M33, . . . (referred to as "the memory cells M11, M12, M13, . . . " hereafter).

To be more specific, as shown in FIG. 5, one terminal of each of the variable resistance elements R11, R21, R31, . . . is connected to a corresponding one of the current steering elements D11, D21, D31, . . . , and the other terminal of each of the variable resistance elements R11, R21, R31, . . . is connected to the bit line BL1. One terminal of each of the variable resistance elements R12, R22, R32, . . . is connected to a corresponding one of the current steering elements D12, D22, D32, . . . , and the other terminal of each of the variable resistance elements R12, R22, R32, . . . is connected to the bit line BL2. One terminal of each of the variable resistance elements R13, R23, R33, . . . is connected to a corresponding one of the current steering elements D13, D23, D33, . . . , and the other terminal of each of the variable resistance elements R13, R23, R33, . . . is connected to the bit line BL3. Moreover, one terminal of each of the current steering elements D11, D12, D13, . . . is connected to a corresponding one of the variable resistance elements R11, R12, R13, . . . , and the other terminal of each of the current steering elements D11, D12, D13, . . . is connected to the word line WL1. One terminal of each of the current steering elements D21, D22, D23, . . . is connected to a corresponding one of the variable resistance elements R21, R22, R23, . . . , and the other terminal of each of the current steering elements D21, D22, D23, . . . is connected to the word line WL2. One terminal of each of the current steering elements D31, D32, D33, . . . is connected to a corresponding one of the variable resistance elements R31, R32, R33, . . . , and the other terminal of each of the current steering elements D31, D32, D33, . . . is connected to the word line WL3.

In Embodiment 1, the variable resistance element is connected on the bit line side and current steering element is connected on the word line side. However, it should be noted that the current steering element may be connected on the bit line side and that the variable resistance element may be connected on the word line side.

The address signal input circuit 208 receives an address signal from an external source. Then, based on the received address signal, the address signal input circuit 208 outputs a line address signal to the word line selection circuit 203 and also outputs a column address signal to the bit line selection circuit 204. Here, the address signal refers to a signal indicating an address of a specific memory cell selected from among the plurality of memory cells M11, M12, M13, . . . .

The variable resistance nonvolatile memory device 200 in Embodiment 1 has: a write mode in which data is written into a memory cell; a regular read mode in which data is read from a memory cell; and a cell characteristic determination mode in which a characteristic of a memory cell is determined. In the write mode, the control circuit 209 outputs, to the write circuit 205, a signal indicating the application of a write voltage, according to input data "Din" received by the data signal input-output circuit 207. In the regular read mode or the cell characteristic determination mode, the control circuit 209 outputs a signal indicating a corresponding operation to the read circuit 206.

The word line selection circuit 203 receives the line address signal from the address signal input circuit 208, and applies a voltage supplied from the write circuit 205 to the word line selected from among the word lines WL1, WL2, WL3, . . . based on the received line address signal. In addition, the word line selection circuit 203 can apply a predetermined nonselected-line voltage (Vss to Vwl, or Vwh) to a nonselected word line or bring the nonselected word line into a high impedance (Hi-Z) state.

Similarly, the bit line selection circuit 204 receives the column address signal from the address signal input circuit 208, and applies a voltage supplied from the write circuit 205 or the read circuit 206 to the bit line selected from among the bit lines BL1, BL2, BL3, . . . based on the received column address signal. In addition, the bit line selection circuit 204 can apply a predetermined nonselected-column voltage (Vss to Vwl, Vwh, or Vbl) to a nonselected bit line or bring the nonselected bit line into the high impedance (Hi-Z) state.

It should be noted that each of the word line selection circuit 203 and the bit line selection circuit 204 corresponds to a memory cell selection circuit according to the present invention.

The write circuit 205 receives a write signal outputted from the control circuit 209 in the write mode. Then, by applying the LR write voltage Vwl or the HR write voltage Vwh to the memory cell selected by the word line selection circuit 203 and the bit-line section circuit 204, the write circuit 205 can bring this memory cell into the low resistance state or the high resistance state. When the memory cell M11 in the variable resistance nonvolatile memory device 200 shown in FIG. 5 is to be brought into the low resistance state, the LR write voltage Vwl that is high in potential with respect to the BL1 is applied to the WL1. As a result, the variable resistance element R11 changes into the low resistance state. Moreover, when the memory cell M11 is to be brought into the high resistance state, the HR write voltage Vwh that is high in potential with respect to the WL1 is applied to the BL1. As a result, the variable resistance element R11 changes into the high resistance state.

In the read mode, the read circuit 206 applies a read voltage between the word line selected by the word line selection circuit 203 and the bit line selected by the bit line selection circuit 204. Then, by determining a memory cell current passing through the memory cell M11 using the sense amplifier 300, the read circuit 206 can read a storage state of the memory cell M11. Moreover, in the cell characteristic determination mode, the read circuit 206 applies a cell characteristic determination clamp voltage "Vct" between the word line selected by the word line selection circuit 203 and the bit line selected by the bit line selection circuit 204. Then, by determining a memory cell current passing through the memory cell M11 using the sense amplifier 300, the read circuit 206 can determine the cell characteristic of the memory cell M11.

Here, the bit-line control voltage generation circuit 500 generates a read clamp voltage "Vcr" (>VF) and the cell characteristic determination clamp voltage Vct (<VF) according to the regular read mode and the cell characteristic determination mode, respectively, to set a potential of the bit line selected by the bit line selection circuit 204.

In the regular read mode, the bit-line voltage switching circuit 400 supplies, to the sense amplifier 300, the read clamp voltage Vcr outputted from the bit-line control voltage generation circuit 500. In the cell characteristic determination mode, the bit-line voltage switching circuit 400 supplies, to the sense amplifier 300, the cell characteristic determination clamp voltage Vct outputted from the bit-line control voltage generation circuit 500.

According to the clamp voltage (Vcr or Vct) supplied by the bit-line voltage switching circuit 400, the sense amplifier 300 sets the potential of the bit line to a predetermined potential in the corresponding regular read mode or cell characteristic determination mode. Moreover, the sense amplifier 300 determines the cell characteristic from the memory cell current read via the bit line selection circuit 204, and outputs a result of the determination to an external source via the data signal input-output circuit 207. The setting of the bit line potential is described later.

Figure 6:
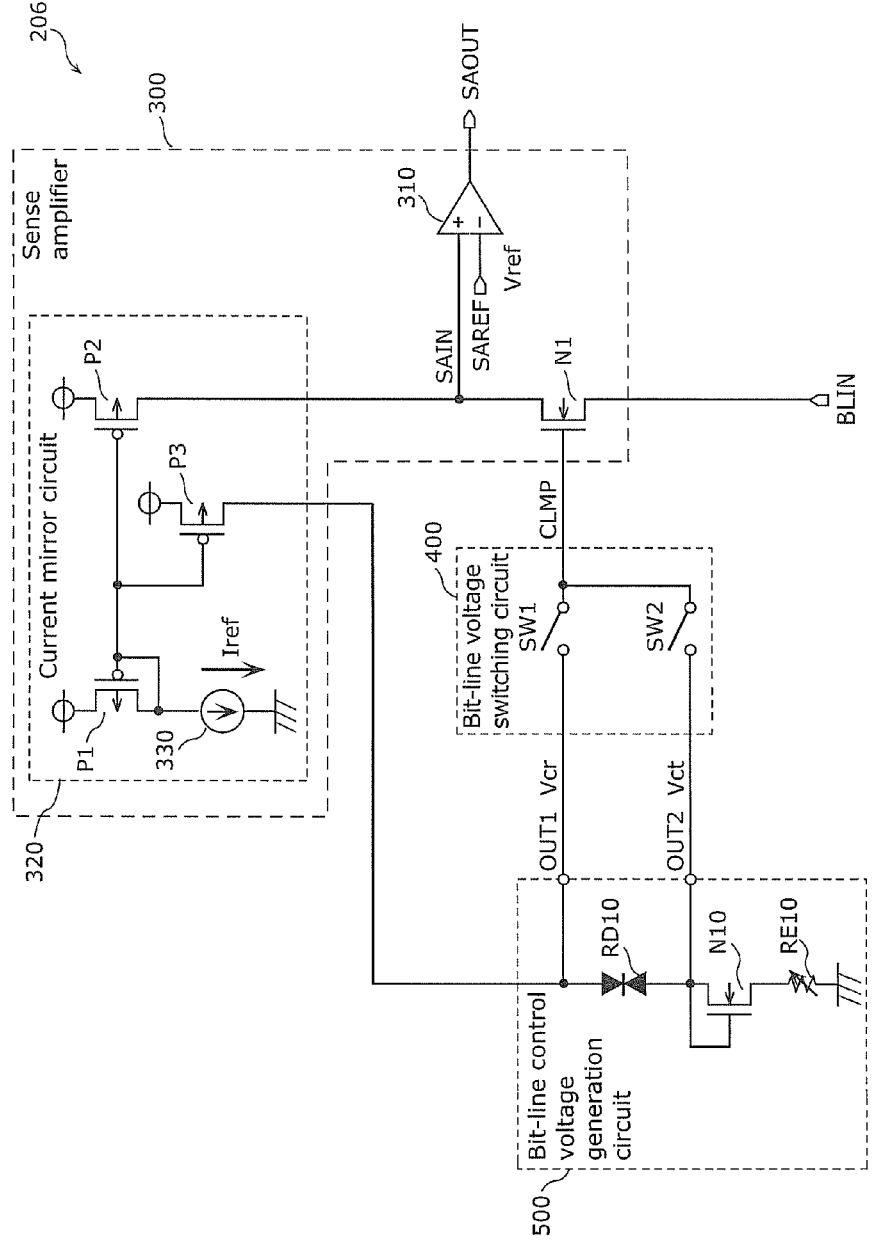
FIG. 6 is a circuit diagram showing an example of a configuration of a read circuit.

FIG. 6 is a circuit diagram showing an example of a configuration of the read circuit 206 shown in FIG. 5.

The read circuit 206 includes the sense amplifier 300, the bit-line voltage switching circuit 400, and the bit-line control voltage generation circuit 500.

The sense amplifier 300 includes a comparison circuit 310, a current mirror circuit 320, and a bit-line voltage control transistor N1 (a bit-line voltage steering circuit). Here, the bit-line voltage control transistor N1 represents, as an example, one of the simplest configurations of the bit-line voltage steering circuit. The current mirror circuit 320 includes a P-channel metal oxide semiconductor (PMOS) transistor P1, a PMOS transistor P2, a PMOS transistor P3, and a constant current circuit 330. Each of source terminals of the PMOS transistor P1, the PMOS transistor P2, and the PMOS transistor P3 of the current mirror circuit 320 is connected to a power source. Gate terminals of the PMOS transistor P1, the PMOS transistor P2, and the PMOS transistor P3 are connected to each other, and are also connected to a drain terminal of the PMOS transistor P1 and one terminal of the constant current circuit 330. The other terminal of the constant current circuit 330 is connected to a ground potential. A drain terminal of the PMOS transistor P2 is connected to one input terminal (a plus terminal, for example) of the comparison circuit 310 and to a drain terminal (an input terminal) of the bit-line voltage control transistor N1. A drain terminal of the PMOS transistor P3 is connected to the bit-line control voltage generation circuit 500. A gate terminal (a control terminal) of the bit-line voltage control transistor N1 is connected to an output terminal of the bit-line voltage switching circuit 400. A source terminal (an output terminal) of the bit-line voltage control transistor N1 is connected to the bit line selection circuit 204 via a terminal "BLIN" of the read circuit 206. The other terminal (a minus terminal, for example) of the comparison circuit 310 is connected to a terminal "SAREF" of the read circuit 206. An output terminal of the comparison circuit 310 is connected to the data signal input-output circuit 207 via a terminal "SAOUT" of the read circuit 206, and then outputs the data to an external source.

Here, a reference current "Iref" passing through the constant current circuit 330 is amplified (or attenuated) according to a mirror ratio M2 (=P2/P1) determined by a size ratio between the PMOS transistor P1 and the PMOS transistor P2 (such as a gate-width ratio in the case of the same gate length). As a result, a load current "Ild2" (=Iref*M2) of the PMOS transistor P2 is determined. Moreover, the reference current Iref passing through the constant current circuit 330 is amplified (or attenuated) according to a mirror ratio M3 (=P3/P1) determined by a size ratio between the PMOS transistor P1 and the PMOS transistor P3. As a result, a load current "Ild3" (=Iref*M3) of the PMOS transistor P3 is determined. When the PMOS transistor P2 and the PMOS transistor P3 are made in the same size, the load currents can be set at the same current value (Ild2=Ild3).

The clamp voltage (Vcr or Vct) outputted from the bit-line voltage switching circuit 400 is applied to the gate terminal (the control terminal) of the bit-line voltage control transistor N1 (the bit-line voltage steering circuit). Therefore, a voltage reduced from the clamp voltage (Vcr or Vct) outputted from the bit-line voltage switching circuit 400 by a threshold voltage "Vtn" of the bit-line voltage control transistor N1 is applied to the source terminal (the output terminal connected to the terminal BLIN) of the bit-line voltage control transistor N1, and is thus applied to the selected bit line via the bit line selection circuit 204. The bit-line voltage steering circuit may have a different configuration as long as the circuit has a characteristic of steering a voltage to be applied to the bit line as described above.

Moreover, the potential of the drain terminal (the input terminal connected to a terminal "SAIN") of the bit-line voltage control transistor N1 is applied to the plus terminal of the comparison circuit 310. Also, a reference voltage "Vref" is applied to the minus terminal of the comparison circuit 310 from the terminal SAREF. The comparison circuit 310 compares the reference voltage Vref applied to the minus terminal and the potential of the terminal SAIN applied to the plus terminal. When the potential of the terminal SAIN is lower than the potential of the terminal SAREF, the comparison circuit 310 outputs a potential L to the output terminal. When the potential of the terminal SAIN is higher than the potential of the terminal SAREF, the comparison circuit 310 outputs a potential H to the output terminal. By doing so, the comparison circuit 310 outputs the state of the memory cell 30 to an external source via the data signal input-output circuit 207.

To be more specific, when the current passing through the memory cell 30 is high, the potential of the terminal SAIN quickly changes from the potential H to the potential L. When the current passing through the memory cell 30 is low, the potential of the terminal SAIN slowly changes from the potential H to the potential L or is maintained at the potential H. Then, the comparison circuit 310 compares the potential of the terminal SAIN and the potential of the terminal SAREF at a predetermined output sense timing. When the potential of the terminal SAIN is lower, the comparison circuit 310 outputs the potential L to the output terminal SAOUT and thus determines that the current passing through the memory cell 30 is high. Similarly, when the potential of the terminal SAIN is higher, the comparison circuit 310 outputs the potential H to the output terminal SAOUT and thus determines that the current passing through the memory cell 30 is low. Although not illustrated in FIG. 6, it should be noted that the reference voltage Vref applied from the terminal SAREF may be generated in the variable resistance nonvolatile memory device 200 or applied from an external terminal.

The voltage to be applied to the gate terminal of the bit-line voltage control transistor N1 is generated by the bit-line control voltage generation circuit 500. The bit-line control voltage generation circuit 500 includes a reference current steering element RD10, an N-channel metal oxide semiconductor (NMOS) transistor N10, and a reference variable resistance element RE10.

One terminal of the reference current steering element RD10 is connected to the drain terminal of the PMOS transistor P3 of the current mirror circuit 320 and to an output terminal "OUT1" of the bit-line control voltage generation circuit 500. The reference current steering element RD10 outputs the read clamp voltage Vcr from the output terminal. The other terminal of the reference current steering element RD10 is connected to the drain terminal and the gate terminal of the NMOS transistor N10 and to an output terminal "OUT2". The reference current steering element RD10 outputs the cell-characteristic clamp voltage Vct from the output terminal.

A source terminal of the NMOS transistor N10 is connected to one terminal of the reference variable resistance element RE10. The other terminal of the reference variable resistance element RE10 is grounded.

Here, the reference current steering element RD10 is configured with the same element as included in the memory cell array 202, such as the current steering elements D11, D12, D13, . . . . Also, the reference variable resistance element RE10 is configured with the same element as included in the memory cell array 202, such as the variable resistance elements R11, R12, R13, . . . . Although not explicitly described here, the reference variable resistance element RE10 can be set to the high resistance state or the low resistance state as is the case with the variable resistance element included in the memory cell array 202. In order to detect a memory cell at least in the low resistance state, it is preferable for the resistance value of the reference variable resistance element RE10 to be set at a value of when the memory cell array 202 is in an average high resistance state.

The read clamp voltage Vcr outputted from the output terminal OUT1 of the bit-line control voltage generation circuit 500 and the cell characteristic determination clamp voltage Vct outputted from the output terminal OUT2 are expressed by Expression 1 and Expression 2, respectively, as follows. Here, note that: a voltage applied to the reference variable resistance element RE10 is represented by Vre (that is approximately the same as the voltage applied to the variable resistance elements R11, R12, R13, . . . ); a threshold voltage of the NMOS transistor N10 is represented by Vtn (that is approximately the same as the threshold voltage of the NMOS transistor N1); and a threshold voltage of the reference current steering element RD10 is represented by VF (that is approximately the same as the threshold voltage of the current steering elements D11, D12, D13, . . . ).

$$Vcr = Vre + Vtn + VF \qquad \text{Expression 1}$$

$$Vct = Vre + Vtn \qquad \text{Expression 2}$$

The NMOS transistor N10 is in the same transistor size as the bit-line voltage control transistor N1 of the sense amplifier 300. The PMOS transistor P3 of the sense amplifier 300 is in the same transistor size as the PMOS transistor P2. Note here that, as long as the size ratio between the bit-line voltage control transistor N1 and the PMOS transistor P2 is maintained, the NMOS transistor N10 and the PMOS transistor P3 may be made in smaller sizes.

With this configuration, the output terminal OUT1 outputs a pseudo voltage higher than the voltage of the terminal BLIN of the read circuit 206 (i.e., the bit line voltage applied in an operation to read a memory cell) by the threshold voltage Vtn of the bit-line voltage control transistor N1. Moreover, the output terminal OUT2 outputs a voltage lower than the voltage of the output terminal OUT1 by the threshold voltage VF of the reference current steering element RD10. It should be noted that the voltages outputted from the output terminal OUT1 and the output terminal OUT2 correspond to a first output and a second output, respectively, in Embodiment 1.

The bit-line voltage switching circuit 400 includes switches "SW1" and "SW2". One terminal of the switch SW1 of the bit-line voltage switching circuit 400 is connected to the output terminal OUT1 of the bit-line control voltage generation circuit 500. One terminal of the switch SW2 is connected to the output terminal OUT2 of the bit-line control voltage generation circuit 500. The other terminal of the switch SW1 and the other terminal of the switch SW2 are connected to each other, and are also connected to the gate terminal of the bit-line voltage control transistor N1 of the sense amplifier 300. In the regular read mode of the sense amplifier 300, the bit-line voltage switching circuit 400 sets the switch SW1 to an ON state and the switch SW2 to an OFF state. By doing so, the bit-line voltage switching circuit 400 outputs the read clamp voltage Vcr of the output terminal OUT1 of the bit-line control voltage generation circuit 500 to the gate terminal of the transistor N1. In the cell characteristic determination mode, the bit-line voltage switching circuit 400 sets the switch SW1 to the OFF state and the switch SW2 to the ON state. By doing so, the bit-line voltage switching circuit 400 outputs the cell characteristic determination clamp voltage Vct of the output terminal OUT2 of the bit-line control voltage generation circuit 500 to the gate terminal of the transistor N1.

With this configuration, the voltage to be applied to the selected bit line does not exceed the voltage lower than the voltage to be applied to the gate terminal of the bit-line voltage control transistor N1 by the threshold voltage Vtn of the transistor N1. Therefore, a bit line voltage "Vblr" applied to the bit line in the regular read mode and a bit line voltage "Vblt" applied to the bit line in the cell characteristic determination mode can be represented by Expression 3 and Expression 4, respectively, as follows.

$$Vblr \leq Vre + VF \qquad \text{Expression 3}$$

$$Vblt \leq Vre \qquad \text{Expression 4}$$

Next, the following describes a memory cell operation performed in the memory cell array when the respective voltages according to Expressions 3 and 4 are applied to the bit line in the regular read mode and the cell characteristic determination mode.

Figure 7:
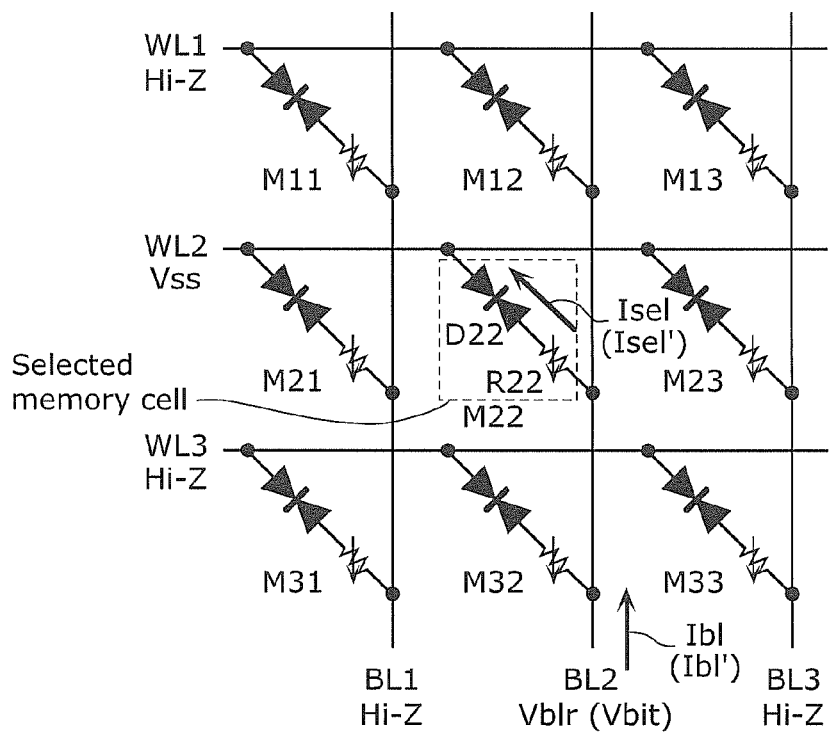
FIG. 7 is a circuit diagram explaining a current path in a memory cell array.
Figure 8:
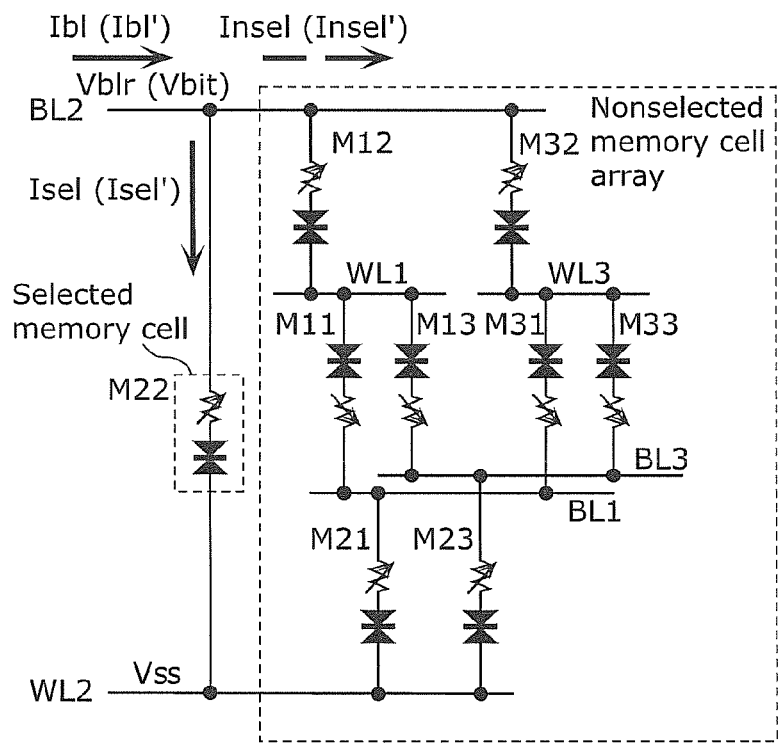
FIG. 8 is an equivalent circuit diagram of the circuit diagram shown in FIG. 7.

FIG. 7 is a circuit diagram explaining a current path in the memory cell array 202. For the sake of simplifying the explanation, this diagram shows an example where the memory cell M22 is to be selected from the memory cell array 202 configured with a 3-by-3 array in FIG. 5 described above. FIG. 8 is an equivalent circuit diagram of the circuit diagram shown in FIG. 7.

In the regular read mode, the memory cell M22 is firstly selected to read the resistance state of the memory cell M22. In order to select the memory cell M22: the potential Vss is applied to the word line WL2 selected by the word line selection circuit 203; the bit line voltage Vblr represented by Expression 3 is applied to the bit line BL2 selected by the bit line selection circuit 204; and the nonselected bit lines BL1 and BL3 and the nonselected word lines WL1 and WL3 are brought into the high impedance states (Hi-Z). Although the nonselected bit lines BL1 and BL3 and the nonselected word lines WL1 and WL3 are brought into the high impedance states in Embodiment 1, each of these lines may be set at a voltage lower than or equal to the voltage applied between the selected bit line BL2 and the selected word line WL2.

As shown in FIG. 8, when the memory cell 22 is selected, each of the memory cells M11, M12, M13, M21, M23, M31, M32, and M33 is expressed equivalently as one of three memory cells connected in series in parallel to the memory cell M22. To be more specific, in the case of the memory cell array having the 1D1R cross point structure shown in FIG. 7, a leakage current path in the nonselected memory cell array is expressed equivalently as a path having a serial connection of three memory cells as shown in FIG. 8. The nonselected memory cell array shown in FIG. 8 has four paths as follows.

[1] M12 ↘ M11 ↘ M21
[2] M12 ↘ M13 ↘ M23
[3] M32 ↘ M31 ↘ M21
[4] M32 ↘ M33 ↘ M23

As shown by the equivalent circuit in FIG. 8, in the cross point array, a selected-bit-line current "Ibl" passing through the selected bit line is a sum of a selected-memory-cell current "Isel" passing through the selected memory cell M22 and a nonselected-memory-cell current "Insel" passing through the nonselected memory cell array.

Here, the voltage applied between the selected bit line BL2 and the selected word line WL2 is applied to the memory cell M22, and the selected-memory-cell current Isel flows according to the resistance state of the memory cell M22. On the other hand, the voltage applied between the selected bit line BL2 and the selected word line WL2 is applied to the nonselected memory cell array. However, since each of the connection combinations has an equivalent serial connection of three memory cells, the bit line voltage Vblr applied to the selected bit line BL2 is divided to be applied to the nonselected memory cells M11, M12, M13, M21, M23, M31, M32 and M33 according to the respective impedances of these nonselected memory cells. When the nonselected memory cells M11, M12, M13, M21, M23, M31, M32 and M33 in the nonselected memory cell array are normal, only a voltage lower than or equal to the threshold voltage VF is applied to each of the respective current steering elements. Thus, each of the current steering elements enters the OFF state, meaning that the nonselected-memory-cell current Insel hardly passes through the nonselected memory cell array. To be more specific, the selected-bit-line current Ibl becomes approximately the same as the selected-memory-cell current Isel. Accordingly, the resistance state of the selected memory cell M22 can be read.

When the selected memory cell M22 is normal and the bit line voltage Vblr represented by Expression 3 is applied to the memory cell M22, a voltage exceeding the threshold voltage VF is applied to the current steering element D22. As a result, the current steering element D22 enters the ON state. Then, the selected-bit-line current Ibl passes through the variable resistance element R22. Here, the value of the selected-bit-line current Ibl is different according to the resistance state (the high resistance state or the low resistance state) of the variable resistance element R22. On this account, the read circuit 206 can determine whether the memory cell M22 is in the high resistance state or the low resistance state by determining the value of the selected-bit-line current Ibl.

On the other hand, when the current steering element D22 of the selected memory cell M22 is faulty, the current steering element D22 can be assumed to be conducting and, therefore, the bit line voltage Vblr is applied entirely to the variable resistance element R22. Thus, regardless of whether the memory cell M22 is in the low resistance state or the high resistance state, a current higher than or equal to the memory cell current that flows in the case of a normal memory cell flows as the aforementioned selected-bit-line current Ibl. This means that the resistance state of the memory cell cannot be read. Hence, it is necessary to detect, according to the cell characteristic determination mode, whether or not the current steering element D22 is faulty.

In order to select the memory cell M22 in the cell characteristic determination mode in which whether or not the current steering element is faulty is determined: the potential Vss is applied to the word line WL2 selected by the word line selection circuit 203; the bit line voltage Vblt represented by Expression 4 is applied to the bit line BL2 selected by the bit line selection circuit 204; and the nonselected bit lines BL1 and BL3 and the nonselected word lines WL1 and WL3 are brought into the high impedance states. To be more specific, the bit line voltage Vblt that is lower than the bit line voltage Vblr in the regular read mode by the threshold voltage VF of the reference current steering element RD10 (approximately the same as the threshold voltage of the current steering element D22) is applied to the bit line BL2. Although the nonselected bit lines BL1 and BL3 and the nonselected word lines WL1 and WL3 are brought into the high impedance states in Embodiment 1, each of these lines may be set at a voltage lower than or equal to the voltage applied between the selected bit line BL2 and the selected word line WL2.

As in the case of the regular read mode, a selected-bit-line current "Ibl'" passing through the selected bit line is a sum of a selected-memory-cell current "Isel'" passing through the selected memory cell M22 and a nonselected-memory-cell current "Insel'" passing through the nonselected memory cell array. Here, the voltage applied between the selected bit line BL2 and the selected word line WL2 is applied to the memory cell M22, and the selected-memory-cell current Isel' flows according to the cell characteristic state of the memory cell M22. On the other hand, the voltage applied between the selected bit line BL2 and the selected word line WL2 is applied to the nonselected memory cell array. However, since each of the connection combinations has an equivalent serial connection of three memory cells, the bit line voltage Vblt applied to the selected bit line BL2 is divided to be applied to the nonselected memory cells M11, M12, M13, M21, M23, M31, M32 and M33 according to the respective impedances of these nonselected memory cells. When the nonselected memory cells M11, M12, M13, M21, M23, M31, M32 and M33 in the nonselected memory cell array are normal, only a voltage lower than or equal to the threshold voltage VF is applied to each of the respective current steering elements. Thus, each of the current steering elements enters the OFF state, meaning that the nonselected-memory-cell current Insel' hardly passes through the nonselected memory cell array. To be more specific, the selected-bit-line current Ibl' becomes approximately the same as the selected-memory-cell current Isel'. Accordingly, the cell characteristic state of the selected memory cell M22 can be read.

Here, when the selected memory cell M22 is normal and the bit line voltage Vblt represented by Expression 4 is applied to the memory cell M22, a voltage lower than or equal to the threshold voltage VF is applied to the current steering element D22. As a result, the current steering element D22 enters the OFF state. Thus, regardless of the resistance state of the variable resistance element R22, the selected-bit-line current Ibl' hardly flows.

On the other hand, when the current steering element D22 of the memory cell M22 is faulty, the current steering element D22 can be assumed to be conducting and, therefore, the bit line voltage Vblt is applied entirely to the variable resistance element R22. Here, when the variable resistance element R22 is in the low resistance state, the selected-bit-line current Ibl' passes through the variable resistance element R22. Therefore, the read circuit 206 can detect that the memory cell M22 is faulty. Note that the read circuit 206 may determine that "the memory cell M22 is faulty" when, for example, the maximum OFF current of a normal current steering element in the low resistance state or a higher current passes through the variable resistance element R22. Here, the maximum OFF current refers to a current passing through the normal current steering element when: the threshold voltage is applied to the normal current steering element in the low resistance state; and the current steering element can be assumed to be in the OFF state.

However, when the variable resistance element R22 is in the high resistance state, the selected-bit-line current Ibl' does not pass through the variable resistance R22. For this reason, whether or not the memory cell M22 is faulty cannot be determined.

More specifically, in the cell characteristic determination mode of the variable resistance nonvolatile memory device 200 using the bidirectional current steering element in Embodiment 1, at least when the variable resistance element of the selected memory cell is in the low resistance state, whether the current steering element of the selected memory cell is in a normal state or a faulty state can be determined and thus an address of the fault can be specified. When the variable resistance element of the selected memory cell is in the high resistance state, the state of the current steering element of the selected memory cell cannot be determined accurately. However, by implementing the cell characteristic determination mode after bringing the variable resistance element of the selected memory cell into the low resistance state, whether the current steering element of the selected memory cell is in the normal state or the faulty state can be determined.

In each of the aforementioned current paths [1] to [4], three memory cells are connected in series. On this account, even when the memory cells with at least two bits or less are faulty in the leakage current path in the nonselected memory cell array, the nonselected-memory-cell current Insel does not flow when the remaining one bit is normal. Therefore, by determining the current passing through the selected memory cell, the address of the fault can be specified. For example, when faulty cells exceeding two bits, such as M12, M11, and M23, are present, only faulty cells with two bits or less are present in each of the leakage current paths [1] to [4]. Thus, the nonselected-memory-cell current Insel does not flow, meaning that the address of the fault can be specified as described. When all the cells in one leakage current path, i.e., all the three bits, are faulty, most of the memory cells included in the memory cell array may be faulty. Therefore, the faulty memory cells can be easily detected through, for example, analysis.

FIG. 9 is a table (mode-specific truth table) showing respective setting states and respective states of the terminal SAOUT of the read circuit 206, in the regular read mode and the cell characteristic determination mode. In FIG. 9, "L" represents a first logic output in Embodiment 1, and indicates that the sense amplifier 300 outputs the potential L when the memory cell is in the low resistance state. Moreover, "H" represents a second logic output in Embodiment 1, and indicates that the sense amplifier 300 outputs the potential H when the memory cell is in the high resistance state.

In the regular read mode, the SW1 and the SW2 of the bit-line voltage switching circuit 400 are in the ON state and the OFF state, respectively, as shown in FIG. 9. Thus, the read clamp voltage Vcr (=Vre+Vtn+VF) is applied to the gate terminal (a node "CLMP") of the bit-line voltage control transistor N1 of the sense amplifier 300. Therefore, the voltage of the selected bit line BL connected to the terminal BLIN via the bit line selection circuit 204 is set lower than or equal to a voltage (Vre+VF) reduced from the read clamp voltage Vcr of the gate terminal of the bit-line voltage control transistor N1 of the sense amplifier 300 by the threshold voltage Vtn of the bit-line voltage control transistor N1.

Here, when the selected memory cell is normal, the current steering element of the memory cell is in the ON state and the memory cell current passing through the memory cell is determined according to the resistance state of the variable resistance element of the memory cell. With this memory cell current, the potential of the terminal SAIN of the sense amplifier 300 of the read circuit 206 changes from the potential H to the potential L via the bit line BL and the bit line selection circuit 204. Here, when the variable resistance element of the memory cell is in the low resistance state, the memory cell current increases and thus the potential of the terminal SAIN quickly changes to the potential L. When the variable resistance element of the memory cell is in the high resistance state, the memory cell current decreases and thus the potential of the terminal SAIN slowly changes to the potential L or is maintained at the potential H. Then, the comparison circuit 310 compares the potential of the terminal SAIN and the potential of the terminal SAREF at a predetermined output timing. When the potential of the terminal SAIN is lower, the comparison circuit 310 outputs the potential L to the output terminal SAOUT and thus determines that the current passing through the memory cell is high. When the potential of the terminal SAIN is higher, the comparison circuit 310 outputs the potential H to the output terminal SAOUT and thus determines that the current passing through the memory cell is low. More specifically, when the sense amplifier 300 outputs the potential L, this means that the memory cell is in the low resistance state. When the sense amplifier 300 outputs the potential H, this means that the memory cell is in the high resistance state.

On the other hand, when the current steering element of the selected memory cell is faulty, most of the voltage applied to the memory cell is applied to the variable resistance element. For this reason, even when the variable resistance element is in the high resistance state, a large amount of the memory cell current may flow. To be more specific, when the variable resistance element is in the low resistance state, the sense amplifier 300 outputs the potential L which indicates that the memory element is in the low resistance state. However, when the variable resistance element is in the high resistance state, the sense amplifier 300 outputs the potential L or the potential H, meaning that the resistance state of the memory cell cannot be accurately determined.

As described thus far, in the regular read mode, when the memory cell is normal, the resistance state of the memory cell can be determined from the potential outputted by the sense amplifier 300. However, when the current steering element of the memory cell is faulty, the resistance state of the memory cell cannot be determined.

In the cell characteristic determination mode, the SW1 and the SW2 of the bit-line voltage switching circuit 400 are in the OFF state and the ON state, respectively, as shown in FIG. 9. Thus, the cell characteristic determination clamp voltage Vct (=Vre+Vtn) is applied to the gate terminal (the node "CLMP") of the bit-line voltage control transistor N1 of the sense amplifier 300. Therefore, the voltage of the selected bit line BL connected to the terminal BLIN via the bit line selection circuit 204 is set lower than or equal to a voltage (Vre) reduced from the cell characteristic determination clamp voltage Vct of the gate terminal of the bit-line voltage control transistor N1 of the sense amplifier 300 by the threshold voltage Vtn of the bit-line voltage control transistor N1.

Here, when the selected memory cell is normal, the current steering element of the memory cell is in the OFF state. Thus, regardless of the resistance state of the variable resistance element of the memory cell, the memory cell current hardly passes through the memory cell. When the sense amplifier 300 of the read circuit 206 determines this memory cell current via the bit line BL and the bit line selection circuit 204, the sense amplifier 300 outputs, as a result, the potential H regardless of the resistance state of the variable resistance element.

On the other hand, when the current steering element of the selected memory cell is faulty, most of the voltage applied to the memory cell is applied to the variable resistance element. For this reason, even when the variable resistance element is in the high resistance state, a large amount of the memory cell current may flow. To be more specific, when the variable resistance element is in the low resistance state, the sense amplifier 300 outputs the potential L. Thus, it can be determined that the current steering element is faulty. However, when the variable resistance element is in the high resistance state, the sense amplifier 300 outputs the potential L or the potential H, meaning that the resistance state of the memory cell cannot be accurately determined.

When the variable resistance element of the memory cell is in the high resistance state, whether the current steering element of the memory cell is in the normal state or the faulty state can be determined by implementing the cell characteristic determination mode after previously bringing the variable resistance element into the low resistance state. When a current higher than or equal to a predetermined current does not pass through the current steering element in the case where the variable resistance element is previously brought into the low resistance state, the current steering element can be clearly determined to be normal. In order to bring the variable resistance element into the low resistance state, the write circuit 205 applies the LR write voltage Vwl that is high in potential with respect to the BL1 is applied to the WL1. As a result, the variable resistance element R11 changes into the low resistance state.

As described, in the cell characteristic determination mode, at least when the variable resistance element of the memory cell is in the low resistance state, the state of the current steering element of the memory cell can be determined. More specifically, when variable resistance element is in the low resistance state and the current higher than or equal to the predetermined current passes through the current steering element, the current steering element of the memory cell can be determined to have a short-circuit fault. It should be noted that the aforementioned maximum OFF current may be used as the predetermined current.

When the variable resistance element of the memory cell is in the high resistance state, the state of the current steering element of the memory cell cannot be determined accurately. However, by implementing the cell characteristic determination mode after bringing the variable resistance element into the low resistance state, whether the current steering element of the memory cell is in the normal state or the faulty state can be determined. The memory cell determined to have the faulty current steering element may not be used, or a predetermined repair process may be performed on this memory cell.

Next, an example of a determination flow performed in the cell characteristic determination mode is described.

Figure 10A:
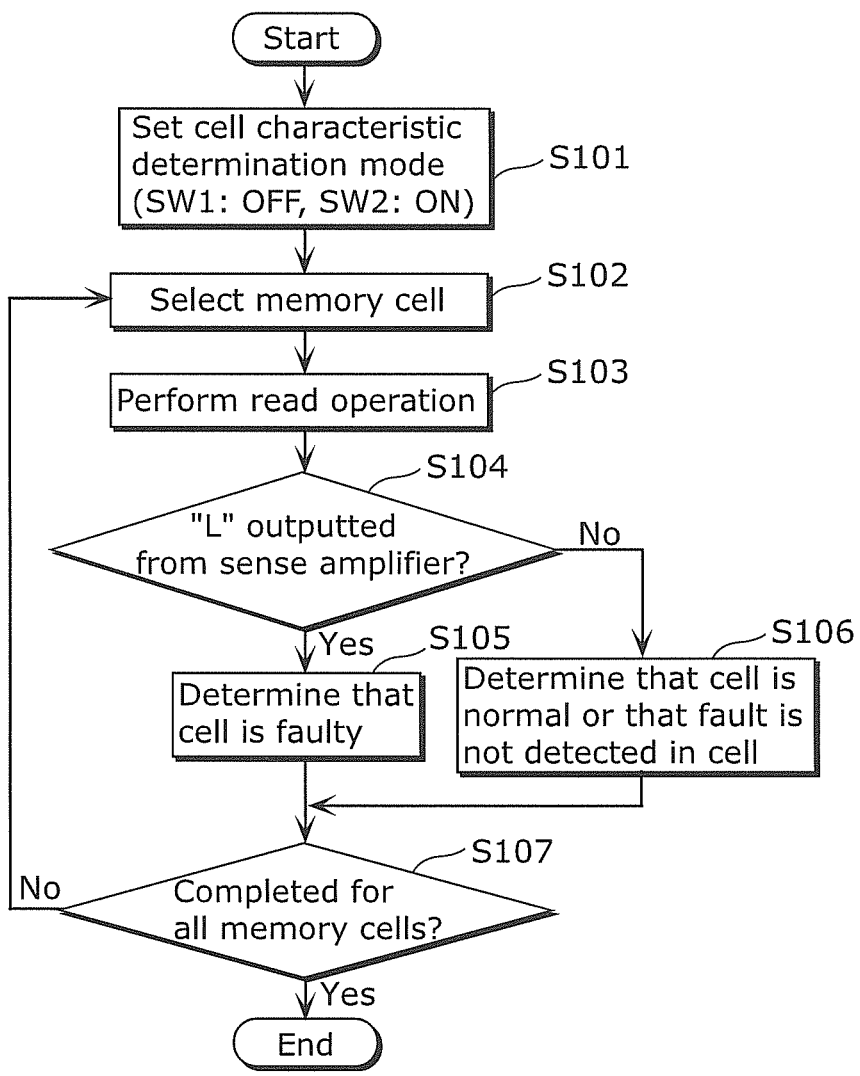
FIG. 10A is a diagram showing an example of a determination flow in a cell characteristic determination mode.

FIG. 10A is a diagram showing an example of the determination flow in the cell characteristic determination mode, regardless of the state of the variable resistance element of the memory cell. Firstly, when the read circuit 206 is set to the cell characteristic determination mode (step S101), the SW1 and the SW2 of the bit-line voltage switching circuit 400 enter the OFF state and the ON state, respectively. With this, the output terminal OUT2 of the bit-line control voltage generation circuit 500 is selected, and the cell characteristic determination clamp voltage Vct is applied to the gate terminal of the bit-line voltage control transistor N1 of the sense amplifier 300.

After this, at least one of the memory cells included in the memory cell array 202 is selected by the word line selected by the word line selection circuit 203 and the bit line selected by the bit line selection circuit 204 (step S102). Moreover, a read operation is performed on the selected memory cell (step S103).

Then, the voltage outputted to the terminal SAOUT of the sense amplifier 300 is determined (step S104). When the output voltage is the potential L, the current steering element of the memory cell is determined to be faulty (step S105). When the output voltage is the potential H, the memory cell is determined to be normal or to have the current steering element where a fault is not detected (step S106). After the determination is completed for the entire memory cell region (step S107), the cell characteristic determination mode is terminated.

To be more specific, according to the determination flow in the cell characteristic determination mode as shown in FIG. 10A, when the potential L is outputted to the terminal SAOUT of the sense amplifier 300, the current steering element of the memory cell is determined to be faulty.

Figure 10B:
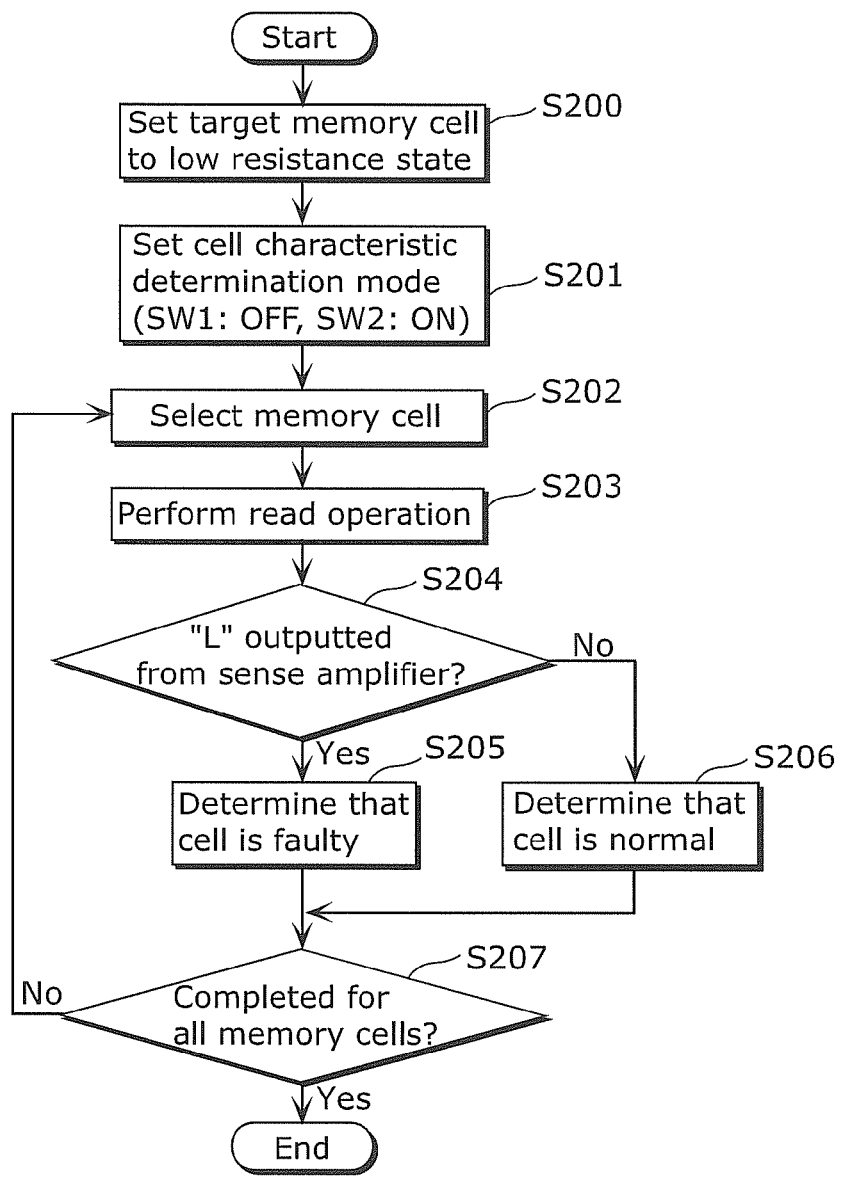
FIG. 10B is a diagram showing an example of a determination flow in the cell characteristic determination mode.

FIG. 10B is a diagram showing an example of the determination flow in the cell characteristic determination mode that is implemented after the variable resistance element of the memory cell is previously brought into the low resistance state. Firstly, the memory cell that is a target of the cell characteristic determination is set to the low resistance state (step S200). Next, when the read circuit 206 is set to the cell characteristic determination mode (step S201), the SW1 and the SW2 of the bit-line voltage switching circuit 400 enter the OFF state and the ON state, respectively. With this, the output terminal OUT2 of the bit-line control voltage generation circuit 500 is selected, and the cell characteristic determination clamp voltage Vct is applied to the gate terminal of the bit-line voltage control transistor N1 of the sense amplifier 300.

After this, at least one of the memory cells included in the memory cell array 202 is selected by the word line selected by the word line selection circuit 203 and the bit line selected by the bit line selection circuit 204 (step S202). Moreover, the aforementioned cell characteristic determination operation (i.e., the operation to read the cell characteristic) is performed on the selected memory cell (step S203).

Then, the voltage outputted to the terminal SAOUT of the sense amplifier 300 is determined (step S204). When the output voltage is the potential L, the current steering element of the memory cell is determined to be faulty (step S205). When the output voltage is the potential H, the memory cell is determined to be normal (step S206). After the determination is completed for the entire memory cell region (step S207), the cell characteristic determination mode is terminated.

To be more specific, according to the determination flow in the cell characteristic determination mode as shown in FIG. 10B, whether or not the current steering element of the memory cell is faulty can be accurately determined by previously setting the variable resistance element of the memory cell to the low resistance state.

Modification of Embodiment 1

Figure 11A:
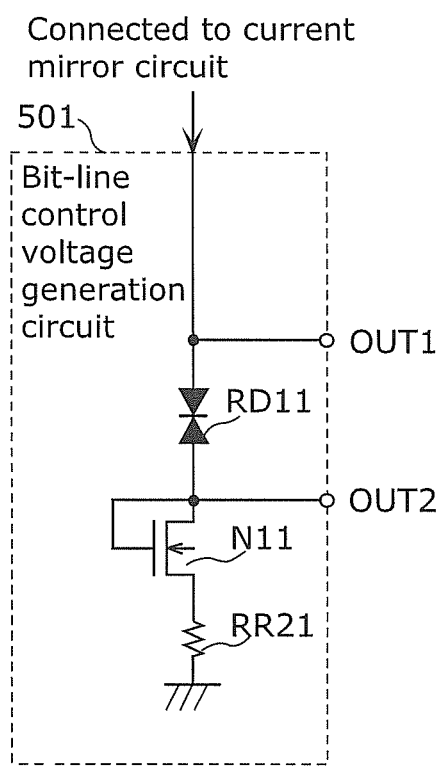
FIG. 11A is a circuit diagram showing a modification of a bit-line control voltage generation circuit.
Figure 11B:
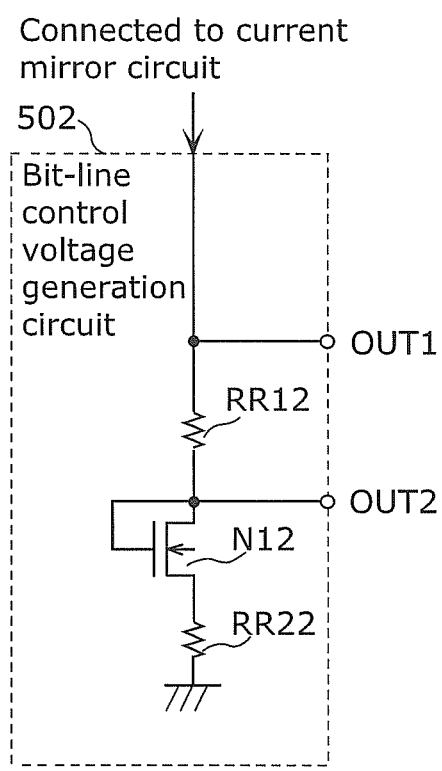
FIG. 11B is a circuit diagram showing a modification of the bit-line control voltage generation circuit.
Figure 11C:
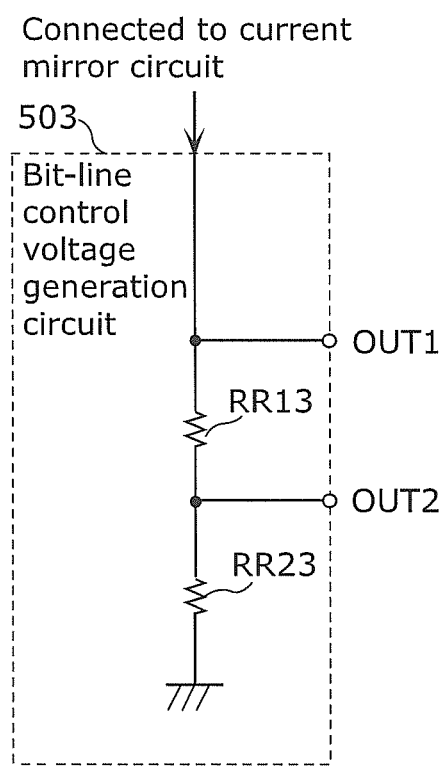
FIG. 11C is a circuit diagram showing a modification of the bit-line control voltage generation circuit.

FIG. 11A to FIG. 11C are circuit diagrams, each showing a modification of the bit-line control voltage generation circuit 500 of the read circuit 206 included in the variable resistance nonvolatile memory device in Embodiment 1 according to the present invention.

FIG. 11A shows an example where a bit-line control voltage generation circuit 501 includes a fixed resistance element RR21 in place of the reference variable resistance element RE10 of the bit-line control voltage generation circuit 500 shown in FIG. 6. A resistance value of the fixed resistance element RR21 is set at a value within a range between the low resistance state and the high resistance state of the reference variable resistance element RE10. Although only one fixed resistance element is described in Modification, a plurality of fixed resistance elements may be provided and independently switched using respective switches.

Since the fixed resistance element RR21 is used instead of the reference variable resistance element RE10, the resistance value of the reference variable resistance element RE10 does not need to be set in advance. Therefore, the bit-line control voltage generation circuit 501 can easily generate the read clamp voltage Vcr and the cell characteristic determination clamp voltage Vct to be outputted to the output terminals OUT1 and OUT2. Moreover, the fixed resistance element RR21 having less variations in the resistance value allows variations in the read clamp voltage Vcr and the cell characteristic determination clamp voltage Vct to be reduced. Hence, the state of the memory cell can be detected more accurately.

FIG. 11B shows an example where a bit-line control voltage generation circuit 502 includes: a fixed resistance element RR22 in place of the reference variable resistance element RE10 of the bit-line control voltage generation circuit 500 shown in FIG. 6; and a fixed resistance element RR12 in place of the reference current steering element RD11 of the bit-line control voltage generation circuit 500. A resistance value of the fixed resistance element RR22 is set at a value within a range between the low resistance state and the high resistance state of the reference variable resistance element RE10. A resistance value of the fixed resistance element RR12 is set at a value such that a voltage corresponding to the threshold voltage VF of the reference current steering element RD11 is applied to both terminals of the fixed resistance element RR12. The fixed resistance element RR22 having less variations in the resistance value allows variations in the read clamp voltage Vcr and the cell characteristic determination clamp voltage Vct to be reduced. Hence, the state of the memory cell can be detected more accurately.

FIG. 11C shows an example where a bit-line control voltage generation circuit 503 includes: a fixed resistance element RR23 in place of the reference variable resistance element RE10 and the NMOS transistor N10 of the bit-line control voltage generation circuit 500 shown in FIG. 6; and a fixed resistance element RR13 in place of the reference current steering element RD10 of the bit-line control voltage generation circuit 500. A resistance value of the fixed resistance element RR23 is set at a value such that a voltage corresponding to the threshold voltage Vtn of the NMOS transistor and the voltage applied to the reference variable resistance RE10 are applied to the fixed resistance element RR23. A resistance value of the fixed resistance element RR13 is set at a value such that a voltage corresponding to the threshold voltage VF of the reference current steering element RD11 is applied to both terminals of the fixed resistance element RR13. The fixed resistance element RR23 having less variations in the resistance value allows variations in the read clamp voltage Vcr and the cell characteristic determination clamp voltage Vct to be reduced. Hence, the state of the memory cell can be detected more accurately.

FIG. 11A to FIG. 11C show the modification examples of the bit-line control voltage generation circuit 500 described in Embodiment 1. Here, each circuit in these examples may have any configuration as long as a voltage exceeding the threshold voltage of the current steering element is outputted to the output terminal OUT1 and a voltage lower than or equal to the threshold voltage of the current steering element of the memory cell is outputted to the output terminal OUT2. Moreover, the reference fixed resistance element may be a variable resistance element.

Embodiment 2

Next, a variable resistance nonvolatile memory device in Embodiment 2 according to the present invention is described.

Figure 12:
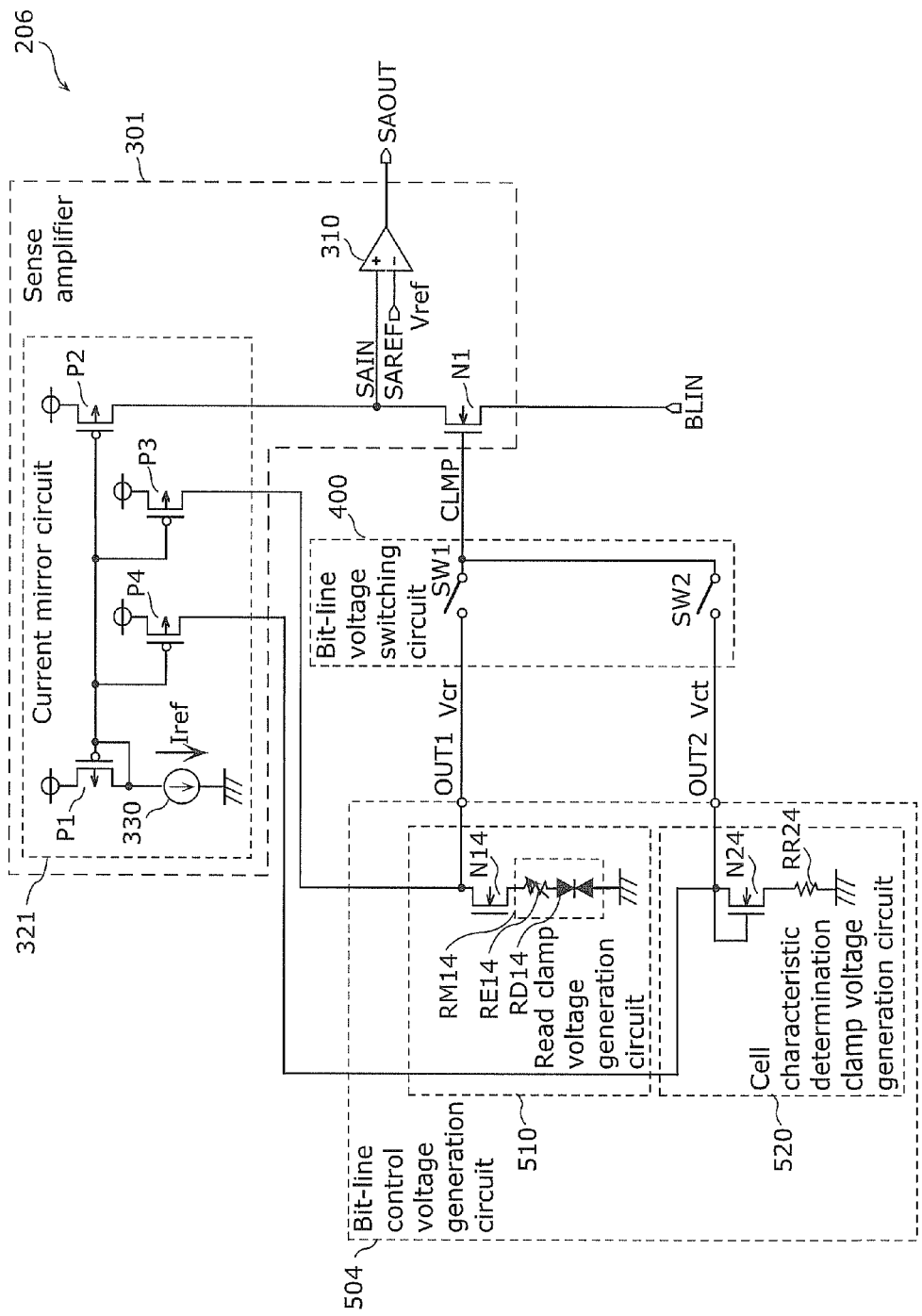
FIG. 12 is a circuit diagram showing an example of a configuration of a read circuit.

FIG. 12 is a circuit diagram showing an example of a configuration of a read circuit 206 in Embodiment 2. Hereafter, when a description is given with reference to a drawing, a component identical to the component having been described above is assigned the same reference sign as used above and the explanation of such an identical component is not be repeated.

The read circuit 206 shown in FIG. 12 includes a sense amplifier 301, a bit-line voltage switching circuit 400, and a bit-line control voltage generation circuit 504.

The sense amplifier 301 includes a comparison circuit 310, a current mirror circuit 321, and a bit-line voltage control transistor N1 (a bit-line voltage steering circuit). The current mirror circuit 321 includes a PMOS transistor P1, a PMOS transistor P2, a PMOS transistor P3, a PMOS transistor 4, and a constant current circuit 330. Each of source terminals of the PMOS transistor P1, the PMOS transistor P2, the PMOS transistor P3, and the PMOS transistor P4 of the current mirror circuit 321 is connected to a power source. Gate terminals of the PMOS transistor P1, the PMOS transistor P2, the PMOS transistor P3, and the PMOS transistor P4 are connected to each other, and are also connected to a drain terminal of the PMOS transistor P1 and one terminal of the constant current circuit 330. The other terminal of the constant current circuit 330 is grounded. A drain terminal of the PMOS transistor P2 is connected to one input terminal (a plus terminal, for example) of the comparison circuit 310 and to a drain terminal (an input terminal) of the bit-line voltage control transistor N1. Each of drain terminals of the PMOS transistor P3 and the PMOS transistor P4 is connected to the bit-line control voltage generation circuit 504. A gate terminal of the bit-line voltage control transistor N1 is connected to an output terminal of the bit-line voltage switching circuit 400. A source terminal of the bit-line voltage control transistor N1 is connected to the bit line selection circuit 204 via a terminal "BLIN" of the read circuit 206. The other terminal (a minus terminal, for example) of the comparison circuit 310 is connected to a terminal "SAREF" of the read circuit 206. An output terminal of the comparison circuit 310 is connected to the data signal input-output circuit 207 via a terminal "SAOUT" of the read circuit 206, and then outputs the data to an external source.

Here, a reference current "Iref" passing through the constant current circuit 330 is amplified (or attenuated) according to a mirror ratio M2 (=P2/P1) determined by a size ratio between the PMOS transistor P1 and the PMOS transistor P2. As a result, a load current "Ild2" (=Iref*M2) of the PMOS transistor P2 is determined. Moreover, the reference current Iref passing through the constant current circuit 330 is amplified (or attenuated) according to a mirror ratio M3 (=P3/P1) determined by a size ratio between the PMOS transistor P1 and the PMOS transistor P3. As a result, a load current "Ild3" (=Iref*M3) of the PMOS transistor P3 is determined. Similarly, the reference current Iref passing through the constant current circuit 330 is amplified (or attenuated) according to a mirror ratio M4 (=P4/P1) determined by a size ratio between the PMOS transistor P1 and the PMOS transistor P4. As a result, a load current Ild4 (=Iref*M4) of the PMOS transistor P4 is determined. When the PMOS transistor P2, the PMOS transistor P3, and the PMOS transistor P4 are made in the same size, the load currents can be set at the same current value (Ild2=Ild3=Ild4).

The voltage to be applied to the gate terminal of the bit-line voltage control transistor N1 is generated by the bit-line control voltage generation circuit 504. The bit-line control voltage generation circuit 504 includes: a read clamp voltage generation circuit 510 that generates a read clamp voltage "Vcr"; and a cell characteristic determination clamp voltage generation circuit 520 that generates a cell characteristic determination clamp voltage "Vct".

The read clamp voltage generation circuit 510 includes an NMOS transistor N14 and a reference memory cell RM14. The reference memory cell RM14 includes a reference variable resistance element RE14 and a reference current steering element RD14 that are connected in series. Here, a drain terminal and a gate terminal of the NMOS transistor N14 are connected to the drain terminal of the PMOS transistor P3 of the current mirror circuit 321, and are also connected to the output terminal OUT1 of the bit-line control voltage generation circuit 504. Then, the read clamp voltage Vcr is outputted from the output terminal OUT1. A source terminal of the NMOS transistor N14 is connected to one terminal of the reference variable resistance element RE14 of the reference memory cell RM14. The other terminal of the reference variable resistance element RE14 is connected to one terminal of the reference current steering element RD14. The other terminal of the reference current steering element RD14 is grounded.

The cell characteristic determination clamp voltage generation circuit 520 includes an NMOS transistor N24 and a reference fixed resistance element RR24. Here, a drain terminal and a gate terminal of the NMOS transistor N24 are connected to the drain terminal of the PMOS transistor P4 of the current mirror circuit 321, and are also connected to the output terminal OUT2 of the bit-line control voltage generation circuit 504. Then, the cell characteristic determination clamp voltage Vct is outputted from the output terminal OUT2. A source terminal of the NMOS transistor N24 is connected to one terminal of the reference fixed resistance element RR24. The other terminal of the reference fixed resistance element RR24 is grounded.

Here, the reference current steering element RD14 of the reference memory cell RM 14 is configured with the same element as included in the memory cell array 202, such as the current steering elements D11, D12, D13, . . . . Also, the reference variable resistance element RE14 of the reference memory cell RM14 is configured with the same element as included in the memory cell array 202, such as the variable resistance elements R11, R12, R13, . . . . The reference fixed resistance element RR24 is set at a resistance value in the low resistance state or the high resistance state of the variable resistance element R11, R12, R13, . . . included in the memory cell array 202. Moreover, the reference fixed resistance element RR24 may be a variable resistance element. Although not explicitly described here, the reference variable resistance element RE14 can be set to the high resistance state or the low resistance state as is the case with the variable resistance element included in the memory cell array 202. In order to detect a memory cell at least in the low resistance state, it is preferable for the resistance value of the reference variable resistance element RE14 and the reference fixed resistance element RR24 to be set at a value of when the memory cell array 202 is in an average high resistance state.

With the configuration described thus far, the reference memory cell RM14 can be implemented by the same configuration as the memory cells M11, M12, M13, . . . included in the memory cell array 202. Thus, the state of the memory cell can be detected more accurately. Moreover, the fixed resistance element RR24 having less variations in the resistance value allows variations in the read clamp voltage Vcr and the cell characteristic determination clamp voltage Vct to be reduced. Hence, the state of the memory cell can be detected more accurately.

Embodiment 3

Next, a variable resistance nonvolatile memory device in Embodiment 3 according to the present invention is described.

Figure 13:
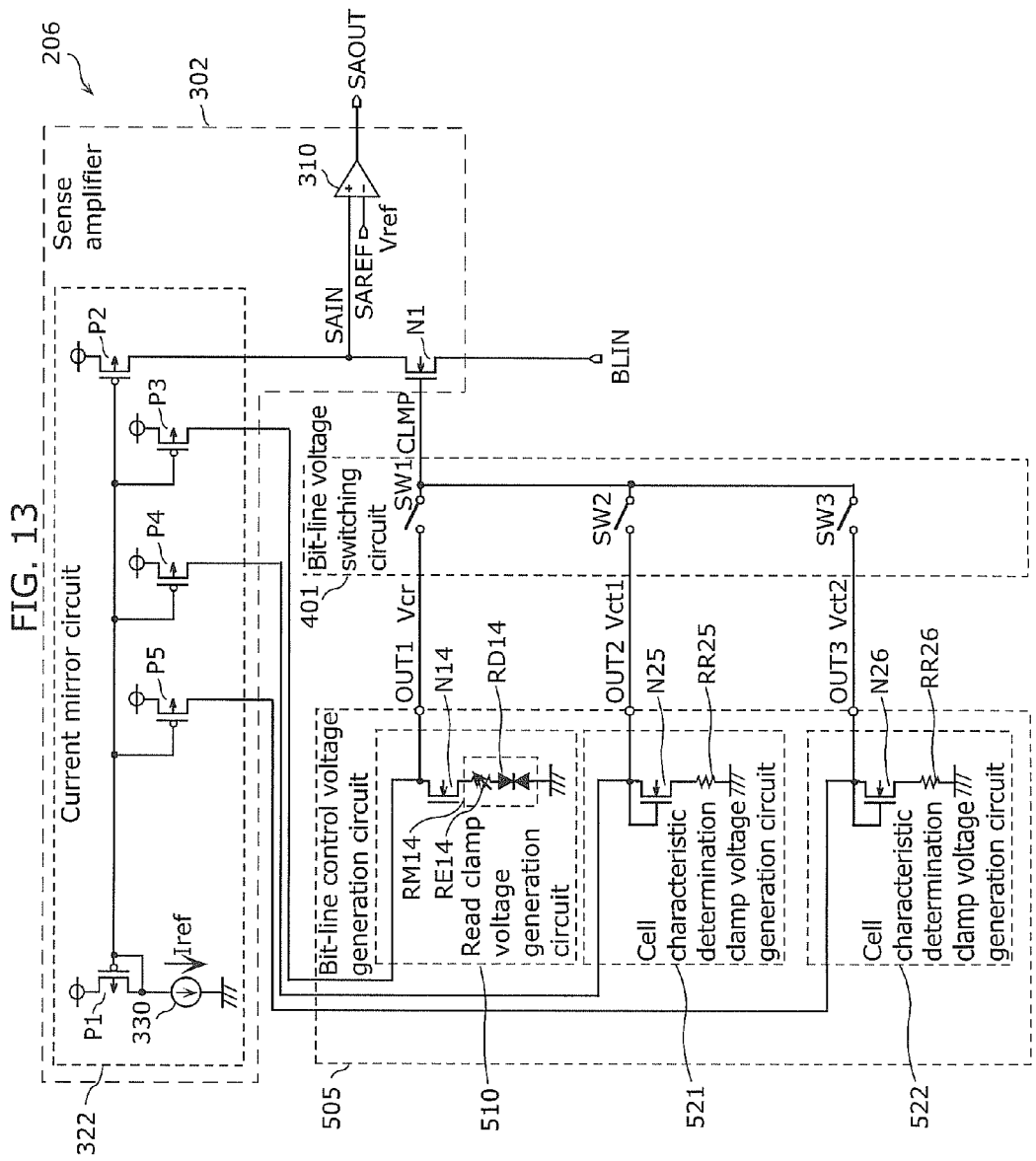
FIG. 13 is a circuit diagram showing an example of a configuration of a read circuit.

FIG. 13 is a circuit diagram showing an example of a configuration of a read circuit 206 in Embodiment 3. This read circuit 206 includes at least two cell characteristic determination clamp voltage generation circuits 520 shown in FIG. 12. Although Embodiment 3 describes the case where the number of the cell characteristic determination clamp voltage generation circuits included in the configuration is two, the number may be three.

The read circuit 206 shown in FIG. 13 includes a sense amplifier 302, a bit-line voltage switching circuit 401, and a bit-line control voltage generation circuit 505.

The sense amplifier 302 includes a comparison circuit 310, a current mirror circuit 322, and a bit-line voltage control transistor N1 (a bit-line voltage steering circuit). The current mirror circuit 322 includes a PMOS transistor P1, a PMOS transistor P2, a PMOS transistor P3, a PMOS transistor 4, a PMOS transistor P5, and a constant current circuit 330. Each of source terminals of the PMOS transistor P1, the PMOS transistor P2, the PMOS transistor P3, the PMOS transistor P4, and the PMOS transistor P5 of the current mirror circuit 321 is connected to a power source. Gate terminals of the PMOS transistor P1, the PMOS transistor P2, the PMOS transistor P3, the PMOS transistor P4, and the PMOS transistor P5 are connected to each other, and are also connected to a drain terminal of the PMOS transistor P1 and one terminal of the constant current circuit 330. The other terminal of the constant current circuit 330 is grounded. A drain terminal of the PMOS transistor P2 is connected to one input terminal (a plus terminal, for example) of the comparison circuit 310 and to a drain terminal of the bit-line voltage control transistor N1. Each of drain terminals of the PMOS transistor P3, the PMOS transistor P4, and the PMOS transistor P5 is connected to the bit-line control voltage generation circuit 505. A gate terminal of the bit-line voltage control transistor N1 is connected to an output terminal of the bit-line voltage switching circuit 401. A source terminal of the bit-line voltage control transistor N1 is connected to the bit line selection circuit 204 via a terminal "BLIN" of the read circuit 206. The other terminal (a minus terminal, for example) of the comparison circuit 310 is connected to a terminal "SAREF" of the read circuit 206. An output terminal of the comparison circuit 310 is connected to the data signal input-output circuit 207 via a terminal "SAOUT" of the read circuit 206, and then outputs the data to an external source.

Here, a reference current "Iref" passing through the constant current circuit 330 is amplified (or attenuated) according to a mirror ratio M2 (=P2/P1) determined by a size ratio between the PMOS transistor P1 and the PMOS transistor P2. As a result, a load current "Ild2" (=Iref*M2) of the PMOS transistor P2 is determined. Moreover, the reference current Iref passing through the constant current circuit 330 is amplified (or attenuated) according to a mirror ratio M3 (=P3/P1) determined by a size ratio between the PMOS transistor P1 and the PMOS transistor P3. As a result, a load current "Ild3" (=Iref*M3) of the PMOS transistor P3 is determined. Similarly, load currents "Ild4" and "Ild5" are determined based on the PMOS transistor P4 and the PMOS transistor P5. When the PMOS transistor P2, the PMOS transistor P3, the PMOS transistor P4, and the PMOS transistor P5 are made in the same size, the load currents can be set at the same current value (Ild2=Ild3=Ild4=Ild5).

The voltage to be applied to the gate terminal of the bit-line voltage control transistor N1 is generated by the bit-line control voltage generation circuit 505. The bit-line control voltage generation circuit 505 includes: a read clamp voltage generation circuit 510 that generates a read clamp voltage "Vcr"; a cell characteristic determination clamp voltage generation circuit 521 that generates a first cell characteristic determination clamp voltage "Vct1"; and a cell characteristic determination clamp voltage generation circuit 522 that generates a second cell characteristic determination clamp voltage "Vct2".

The read clamp voltage generation circuit 510 includes an NMOS transistor N14 and a reference memory cell RM14. The reference memory cell RM14 includes a reference variable resistance element RE14 and a reference current steering element RD14 that are connected in series. Here, a drain terminal and a gate terminal of the NMOS transistor N14 are connected to the drain terminal of the PMOS transistor P3 of the current mirror circuit 322, and are also connected to the output terminal OUT1 of the bit-line control voltage generation circuit 505. Then, the read clamp voltage Vcr is outputted from the output terminal OUT1. A source terminal of the NMOS transistor N14 is connected to one terminal of the reference variable resistance element RE14 of the reference memory cell RM14. The other terminal of the reference variable resistance element RE14 is connected to one terminal of the reference current steering element RD14. The other terminal of the reference current steering element RD14 is grounded.

The cell characteristic determination clamp voltage generation circuit 521 includes an NMOS transistor N25 and a reference fixed resistance element RR25. Here, a drain terminal and a gate terminal of the NMOS transistor N25 are connected to the drain terminal of the PMOS transistor P4 of the current mirror circuit 322, and are also connected to the output terminal OUT2 of the bit-line control voltage generation circuit 505. Then, the first cell characteristic determination clamp voltage Vct1 is outputted from the output terminal OUT2. A source terminal of the NMOS transistor N25 is connected to one terminal of the reference fixed resistance element RR25. The other terminal of the reference fixed resistance element RR25 is grounded.

Similarly, the cell characteristic determination clamp voltage generation circuit 522 includes an NMOS transistor N26 and a reference fixed resistance element RR26. Here, a drain terminal and a gate terminal of the NMOS transistor N26 are connected to the drain terminal of the PMOS transistor P5 of the current mirror circuit 322, and are also connected to the output terminal OUT3 of the bit-line control voltage generation circuit 505. Then, the second cell characteristic determination clamp voltage Vct2 is outputted from the output terminal OUT3. A source terminal of the NMOS transistor N26 is connected to one terminal of the reference fixed resistance element RR26. The other terminal of the reference fixed resistance element RR26 is grounded.

Here, the reference current steering element RD14 of the reference memory cell RM 14 is configured with the same element as included in the memory cell array 202, such as the current steering elements D11, D12, D13, . . . . Also, the reference variable resistance element RE14 of the reference memory cell RM14 is configured with the same element as included in the memory cell array 202, such as the variable resistance elements R11, R12, R13, . . . . Each of the reference fixed resistance elements RR25 and RR26 is set at a resistance value in the low resistance state or the high resistance state of the variable resistance element R11, R12, R13, . . . included in the memory cell array 202. Moreover, each of the reference fixed resistance elements RR25 and RR26 may be a variable resistance element. Although not explicitly described here, the reference variable resistance element RE14 can be set to the high resistance state or the low resistance state as is the case with the variable resistance element included in the memory cell array 202. In order to detect a memory cell at least in the low resistance state, it is preferable for each of the resistance values of the reference variable resistance element RE14 and the reference fixed resistance elements RR25 and RR26 to be set at a value of when the memory cell array 202 is in an average high resistance state.

The read clamp voltage Vcr outputted from the output terminal OUT1 of the bit-line control voltage generation circuit 500, the first cell characteristic determination clamp voltage Vct1 outputted from the output terminal OUT2, and the second cell characteristic determination clamp voltage Vct2 outputted from the output terminal OUT3 are expressed by Expression 5, Expression 6, and Expression 7, respectively, as follows. Here, note that: a voltage applied to the reference variable resistance element RE14 is represented by Vre (that is approximately the same as the voltage applied to the variable resistance elements R11, R12, R13, . . . ); threshold voltages of the NMOS transistors N14, N25, N26 are represented by Vtn (that is approximately the same as the threshold voltage of the NMOS transistor N1); a threshold voltage of the reference current steering element RD14 is represented by VF (that is approximately the same as the threshold voltage of the current steering elements D11, D12, D13, . . . ); and voltages applied to the reference fixed resistance elements RR25 and RR26 are represented by Vre1 and Vre2, respectively.

$$Vcr = Vre + Vtn + VF \qquad \text{Expression 5}$$

$$Vct1 = Vr1 + Vtn \qquad \text{Expression 6}$$

$$Vct2 = Vr2 + Vtn \qquad \text{Expression 7}$$

Each of the NMOS transistors N14, N25, N26 is in the same transistor size as the bit-line voltage control transistor N1 of the sense amplifier 302. Each of the PMOS transistors P3, P4, and P5 of the sense amplifier 302 is in the same transistor size as the PMOS transistor P2. Note here that as long as the size ratio between the bit-line voltage control transistor N1 and the PMOS transistor P2 is maintained, the NMOS transistor N14 and the PMOS transistor P3 may be made in smaller sizes. Similarly, as long as the size ratio between the bit-line voltage control transistor N1 and the PMOS transistor P2 is maintained, the NMOS transistor N25 and the PMOS transistor P4 may be made in smaller sizes and also the NMOS transistor N26 and the PMOS transistor P5 may be made in smaller sizes. With this configuration, the output terminal OUT1 outputs a pseudo voltage higher than the voltage of the terminal BLIN of the read circuit 206 (i.e., the bit line voltage applied in an operation to read a memory cell) by the threshold voltage Vtn of the bit-line voltage control transistor N1. Moreover, the output terminal OUT2 outputs a total voltage of: a voltage lower than the voltage of the output terminal OUT1 by the threshold voltage VF of the reference current steering element RD14; and a difference voltage between the voltage Vre applied to the reference variable resistance element RE14 and the voltage Vre1 applied to the reference fixed resistance element RR25 (the difference voltage is calculated by Vre−Vre1). Moreover, the output terminal OUT3 outputs a total voltage of: a voltage lower than the voltage of the output terminal OUT1 by the threshold voltage VF of the reference current steering element RD14; and a difference voltage between the voltage Vre applied to the reference variable resistance element RE14 and the voltage Vre2 applied to the reference fixed resistance element RR26 (the difference voltage is calculated by Vre−Vre2).

The bit-line voltage switching circuit 401 includes switches SW1, SW2, and SW3. One terminal of the switch SW1 of the bit-line voltage switching circuit 401 is connected to the output terminal OUT1 of the bit-line control voltage generation circuit 505. One terminal of the switch SW2 is connected to the output terminal OUT2 of the bit-line control voltage generation circuit 505. One terminal of the switch SW3 is connected to the output terminal OUT3 of the bit-line control voltage generation circuit 505. The other terminal of the switch SW1, the other terminal of the switch SW2, and the other terminal of the switch SW3 are connected to each other, and are also connected to the gate terminal of the bit-line voltage control transistor N1 of the sense amplifier 302. In the regular read mode of the sense amplifier 302, the bit-line voltage switching circuit 401 sets the switch SW1 to the ON state and the switches SW2 and SW3 to the OFF states. By doing so, the bit-line voltage switching circuit 401 outputs the read clamp voltage Vcr of the output terminal OUT1 of the bit-line control voltage generation circuit 505 to the gate terminal of the transistor N1. In the cell characteristic determination mode, the bit-line voltage switching circuit 401 sets: the switch SW1 to the OFF state; one of the switches SW2 and SW3 to the ON state; and the other of the switches SW2 and SW3 to the OFF state. By doing so, the bit-line voltage switching circuit 401 outputs the first cell characteristic determination clamp voltage Vct1 of the output terminal OUT2 of the bit-line control voltage generation circuit 505 or the second cell characteristic determination clamp voltage Vct2 of the output terminal OUT3 of the bit-line control voltage generation circuit 505 to the gate terminal of the transistor N1. More specifically, the bit-line voltage switching circuit 401 applies, to the gate terminal of the transistor N1 of the sense amplifier 302, the read clamp voltage Vcr in the regular read mode and the first cell characteristic determination clamp voltage Vct1 or the second cell characteristic determination clamp voltage Vct2 in the cell characteristic determination mode.

With this configuration, the voltage to be applied to the bit line does not exceed the voltage lower than the voltage to be applied to the gate terminal of the bit-line voltage control transistor N1 by the threshold voltage Vtn of the transistor N1. Thus, a bit line voltage "Vblr" applied to the bit line in the regular read mode can be represented by Expression 8 below. Moreover, a bit line voltage "Vblt1" applied to the bit line in the cell characteristic determination mode (where the SW1 is in the ON state and the SW2 is in the OFF state) can be represented by Expression 9 below. Furthermore, a bit line voltage "Vblt2" applied to the bit line in the cell characteristic determination mode (where the SW1 is in the OFF state and the SW2 is in the ON state) can be represented by Expression 10 below.

$Vblr \leq Vre + VF$     Expression 8

$Vblt1 \leq Vre1$     Expression 9

$Vblt2 \leq Vre2$     Expression 10

With this configuration, in the regular read mode, a voltage exceeding the threshold voltage VF of the current steering element is applied to the bit line. This brings the current steering element included in the memory cell array 202 into the ON state and, therefore, the state of the memory cell can be detected. Moreover, in the cell characteristic determination mode, a voltage lower than or equal to the threshold voltage VF of the current steering element to be applied to the bit line is switched between the plurality of voltages. Hence, the characteristics of the current steering elements having various variations can be detected.

Figure 14:
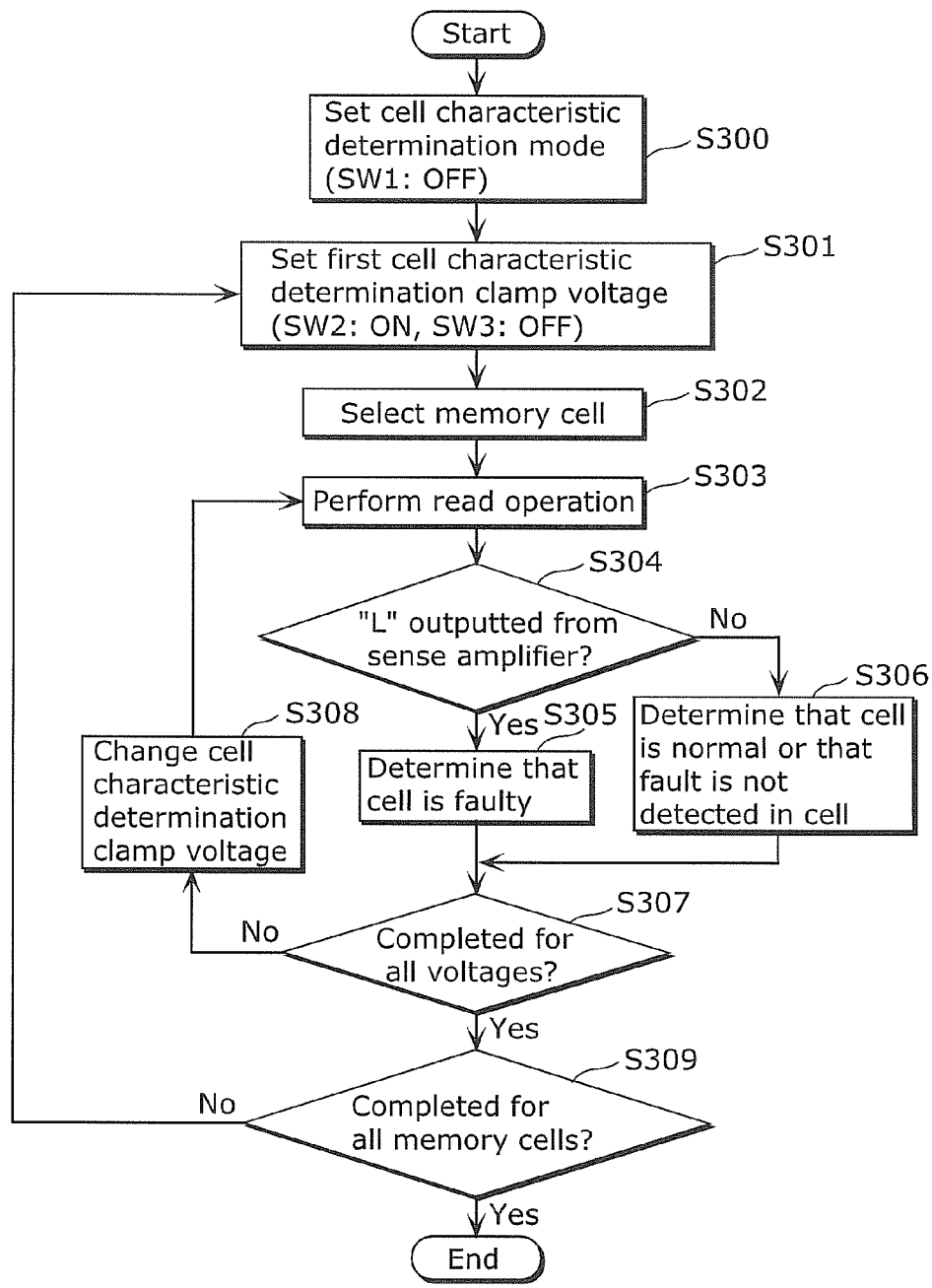
FIG. 14 is a diagram showing an inspection flow in the cell characteristic determination mode.

FIG. 14 is a diagram showing an example of the determination flow in the cell characteristic determination mode implemented by the variable resistance nonvolatile memory device in Embodiment 3. This determination flow is explained using, as an example, the circuit diagram shown in FIG. 13 and assumes that a first clamp voltage and a second clamp voltage can be set.

Firstly, when the mode is set to the cell characteristic determination mode (step S300), the SW1 of the bit-line voltage switching circuit 401 enters the OFF state. Next, in order to set the first cell characteristic clamp voltage (step S301), the SW2 and the SW3 of the bit-line voltage switching circuit 401 are brought into the ON state and the OFF state, respectively. With this, the output terminal OUT2 of the bit-line control voltage generation circuit 505 is selected, and the first cell characteristic determination clamp voltage Vct1 is applied to the gate terminal of the bit-line voltage control transistor N1 of the sense amplifier 302. After this, at least one of the memory cells included in the memory cell array 202 is selected by the word line selected by the word line selection circuit 203 and the bit line selected by the bit line selection circuit 204 (step S302). Moreover, the aforementioned cell characteristic determination operation (i.e., the operation to read the cell characteristic) is performed on the selected memory cell (step S303). Then, the output voltage of the sense amplifier 302 is determined (step S304). When the output voltage is the potential L, the current steering element of the memory cell is determined to be faulty (step S305). When the output voltage is the potential H, the memory cell is determined to be normal or to have the current steering element where a fault is not detected (step S306). When the detection is completed for each of the cell characteristic determination clamp voltages (Yes in step S307), the cell characteristic determination mode is terminated after the determination is completed for the entire memory cell region (step S309). When the detection is not completed for each of the cell characteristic determination clamp voltages (No in step S307), the voltage is switched to a next cell characteristic determination clamp voltage (the second or later cell characteristic determination clamp voltage) (step S308). Then, the flow from the read operation (step S303) is repeated.

To be more specific, the determination flow in the cell characteristic determination mode shown in FIG. 14 can detect the states of the memory cells sequentially using the plurality of cell characteristic determination voltages. Thus, variations or the like in the threshold voltages of the current steering elements of the memory cells can be evaluated.

In the cell characteristic determination mode implemented in FIG. 14, it is preferable for the evaluation to be made firstly using a lower cell characteristic determination clamp voltage. Then, it is preferable to next use a higher cell characteristic determination clamp voltage. This is because, when the higher cell characteristic determination clamp voltage is firstly set, there may be the following case when the current steering element of the memory cell is faulty. That is, when the set higher cell characteristic determination clamp voltage is applied to the variable resistance element of the memory cell and then exceeds the write voltage of the variable resistance element, the state of the variable resistance element may change. In particular, when the variable resistance element changes to the high resistance state, the faulty state of the memory cell may not be detected as described above with reference to the mode-specific truth table shown in FIG. 9. Moreover, it is preferable for the polarity of the voltage applied in the cell characteristic determination mode to be such that the memory cell changes to the low resistance state.

Embodiment 4

Next, a variable resistance nonvolatile memory device in Embodiment 4 according to the present invention is described.

Figure 15:
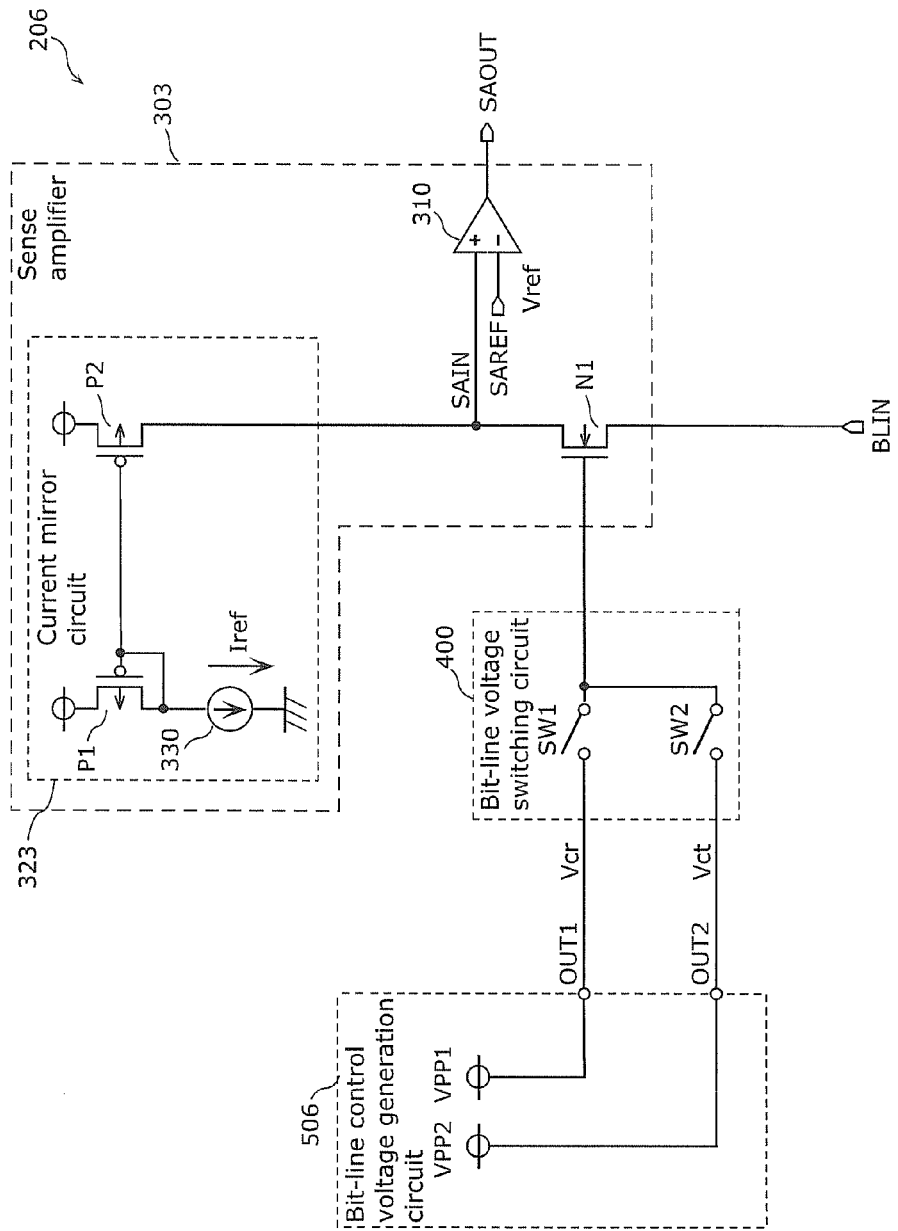
FIG. 15 is a circuit diagram showing an example of a configuration of a read circuit.

FIG. 15 is a circuit diagram showing an example of a configuration of a read circuit 206 in Embodiment 4. FIG. 15 shows an example of a configuration where at least two voltage sources are included in a bit-line control voltage generation circuit 506. Although Embodiment 4 describes the case where the number of the voltage sources included in the configuration is two, the number may be three or more and the voltage sources may be switched by switches included in a bit-line voltage switching circuit 400.

The read circuit 206 shown in FIG. 15 includes a sense amplifier 303, the bit-line voltage switching circuit 400, and the bit-line control voltage generation circuit 506.

The bit-line control voltage generation circuit 506 includes a voltage sources VPP1 and VPP2. The voltage source VPP1 outputs a read clamp voltage Vcr from the output terminal OUT1 of the bit-line control voltage generation circuit 506. The voltage source VPP2 outputs a cell characteristic determination clamp voltage Vct from the output terminal OUT2 of the bit-line control voltage generation circuit 506. It should be noted that the voltage sources VPP1 and VPP2 may be included in the nonvolatile memory device or supplied by an external power source.

The sense amplifier 303 includes a comparison circuit 310, a current mirror circuit 323, and a bit-line voltage control transistor N1 (a bit-line voltage steering circuit). The current mirror circuit 323 includes a PMOS transistor P1, a PMOS transistor P2, and a constant current circuit 330. Each of source terminals of the PMOS transistor P1 and the PMOS transistor P2 of the current mirror circuit 323 is connected to a power source. Gate terminals of the PMOS transistor P1 and the PMOS transistor P2 are connected to each other, and are also connected to a drain terminal of the PMOS transistor P1 and one terminal of the constant current circuit 330. The other terminal of the constant current circuit 330 is grounded. A drain terminal of the PMOS transistor P2 is connected to one input terminal (a plus terminal, for example) of the comparison circuit 310 and to a drain terminal (an input terminal) of the bit-line voltage control transistor N1. A gate terminal of the bit-line voltage control transistor N1 is connected to an output terminal of the bit-line voltage switching circuit 400. A source terminal of the bit-line voltage control transistor N1 is connected to the bit line selection circuit 204 via a terminal "BLIN" of the read circuit 206. The other terminal (a minus terminal, for example) of the comparison circuit 310 is connected to a terminal "SAREF" of the read circuit 206. An output terminal of the comparison circuit 310 is connected to the data signal input-output circuit 207 via a terminal "SAOUT" of the read circuit 206, and then outputs the data to an external source.

The voltage to be applied to the gate terminal of the bit-line voltage control transistor N1 is supplied by the voltage source VPP1 or the voltage source VPP2. The voltage source VPP1 generates the read clamp voltage Vcr represented by Expression 1. The voltage source VPP2 generates the cell characteristic determination clamp voltage Vct represented by Expression 2.

The bit-line voltage switching circuit 400 includes switches "SW1" and "SW2". One terminal of the switch SW1 of the bit-line voltage switching circuit 400 is connected to the voltage source VPP1. One terminal of the switch SW2 is connected to the voltage source VPP2. The other terminal of the switch SW1 and the other terminal of the switch SW2 are connected to each other, and are also connected to the gate terminal of the bit-line voltage control transistor N1 of the sense amplifier 303. In the regular read mode of the sense amplifier 303, the bit-line voltage switching circuit 400 sets the switch SW1 to an ON state and the switch SW2 to an OFF state. By doing so, the bit-line voltage switching circuit 400 outputs the read clamp voltage Vcr of the voltage source VPP1 to the gate terminal of the transistor N1. In the cell characteristic determination mode, the bit-line voltage switching circuit 400 sets the switch SW1 to the OFF state and the switch SW2 to the ON state. By doing so, the bit-line voltage switching circuit 400 outputs the cell characteristic determination clamp voltage Vct of the voltage source VPP2 to the gate terminal of the transistor N1. More specifically, the bit-line voltage switching circuit 400 applies, to the gate terminal of the transistor N1 of the sense amplifier 303, the read clamp voltage Vcr in the regular read mode and the cell characteristic determination clamp voltage Vct in the cell characteristic determination mode.

With this configuration, the voltage to be applied to the bit line does not exceed the voltage lower than the voltage to be applied to the gate terminal of the bit-line voltage control transistor N1 by the threshold voltage Vtn of the transistor N1. Thus, a bit line voltage "Vblr" applied to the bit line in the regular read mode can be represented by Expression 3. Moreover, a bit line voltage "Vblt" applied to the bit line in the cell characteristic determination mode can be represented by Expression 4. Using the stable voltage sources, the state of the memory cell can be detected more accurately.

Embodiment 5

Next, a variable resistance nonvolatile memory device in Embodiment 5 according to the present invention is described.

Figure 16:
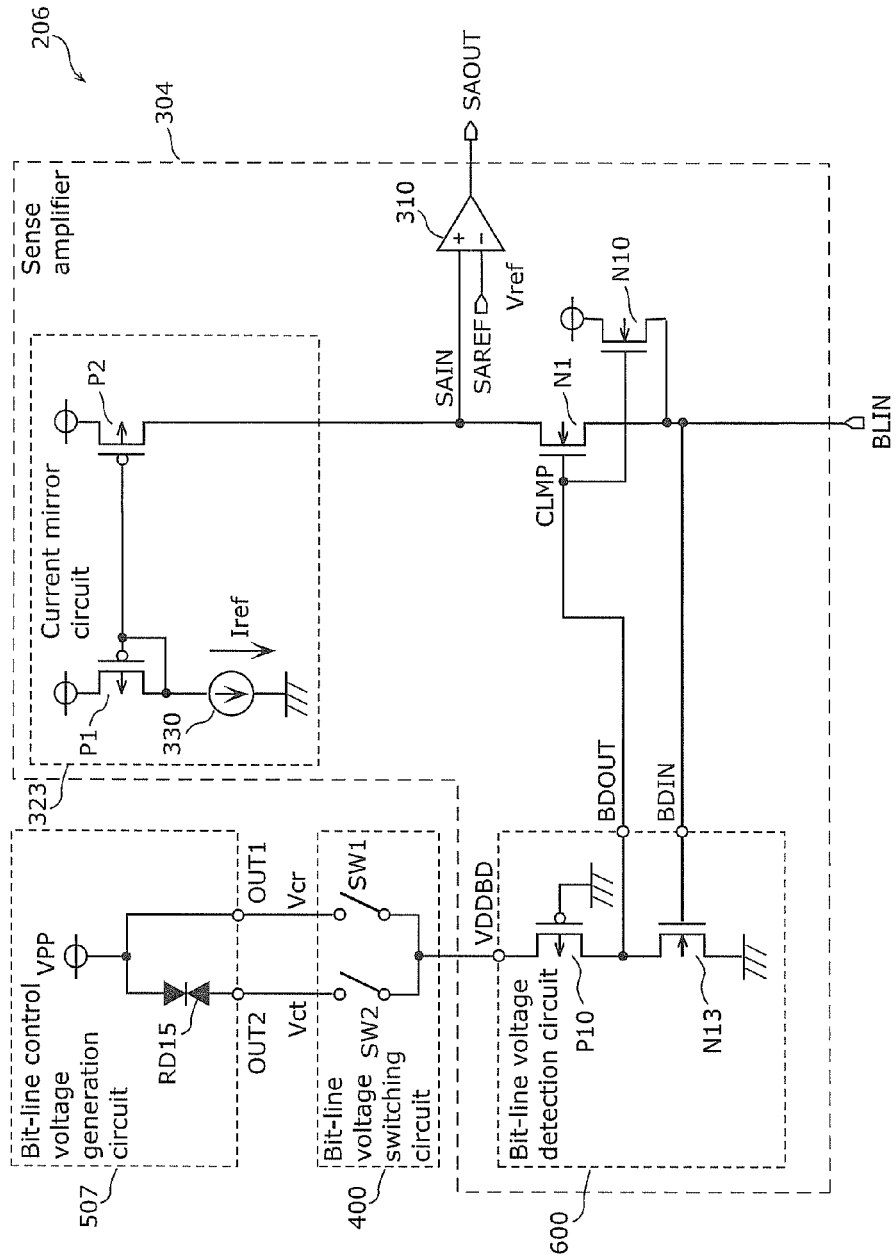
FIG. 16 is a circuit diagram showing an example of a configuration of a read circuit.
Figure 17:
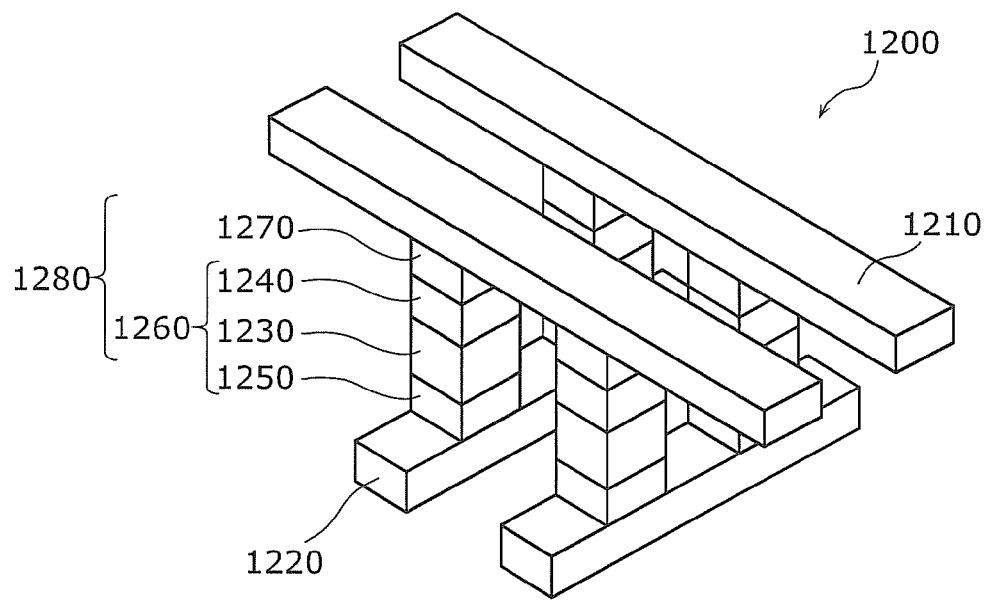
FIG. 17 is a diagram showing a configuration of a conventional nonvolatile memory cell.
Figure 18:
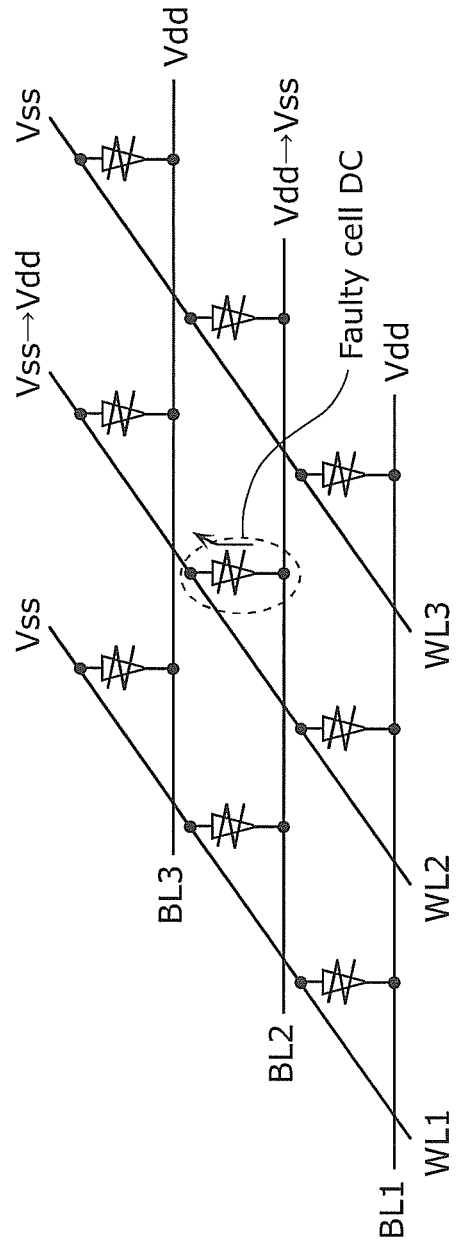
FIG. 18 is a diagram showing a configuration of a conventional nonvolatile memory cell array.
Figure 19:
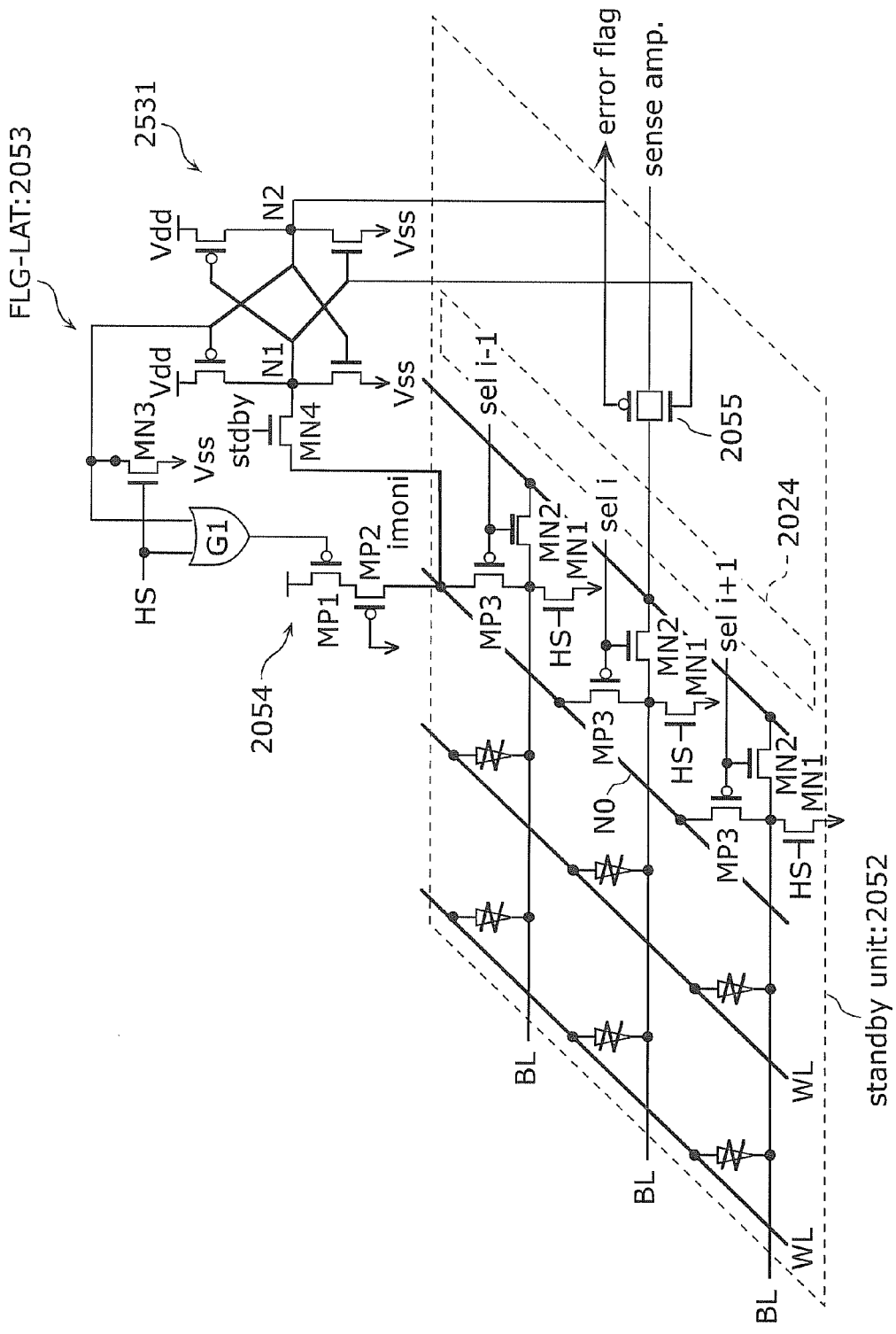
FIG. 19 is a diagram showing a model of a memory cell that employs a conventional unidirectional diode.

FIG. 16 is a circuit diagram showing an example of a configuration of a read circuit 206 in Embodiment 5.

The read circuit 206 shown in FIG. 16 includes a sense amplifier 304, a bit-line voltage switching circuit 400, and a bit-line control voltage generation circuit 507.

The bit-line control voltage generation circuit 507 includes a voltage source VPP and a reference current steering element RD15. The voltage source VPP outputs a read clamp voltage Vcr from the output terminal OUT1 of the bit-line control voltage generation circuit 507. The voltage source VPP is connected to one terminal of the reference current steering element RD15. The other terminal of the reference current steering element RD15 is connected to the output terminal OUT2 of the bit-line control voltage generation circuit 507. The reference current steering element RD15 outputs a cell characteristic determination clamp voltage Vct. It should be noted that the voltage source VPP may be included in the nonvolatile memory device or supplied by an external power source.

The sense amplifier 304 includes a comparison circuit 310, a current mirror circuit 323, a bit-line voltage control transistor N1 (a bit-line voltage steering circuit), a bit-line precharge transistor N11, and a bit-line voltage detection circuit 600. The current mirror circuit 323 includes a PMOS transistor P1, a PMOS transistor P2, and a constant current circuit 330. Each of source terminals of the PMOS transistor P1 and the PMOS transistor P2 of the current mirror circuit 323 is connected to a power source. Gate terminals of the PMOS transistor P1 and the PMOS transistor P2 are connected to each other, and are also connected to a drain terminal of the PMOS transistor P1 and one terminal of the constant current circuit 330. The other terminal of the constant current circuit 330 is grounded. A drain terminal of the PMOS transistor P2 is connected to one input terminal (a plus terminal, for example) of the comparison circuit 310 and to a drain terminal of the bit-line voltage control transistor N1. A gate terminal of the bit-line voltage control transistor N1 is connected to a gate terminal of the bit-line precharge transistor N11 and to an output terminal "BDOUT" of the bit-line voltage detection circuit 600. A source terminal of the bit-line voltage control transistor N1 is connected to the bit line selection circuit 204 via a terminal BLIN of the read circuit 206, and is also connected to a source terminal of the bit-line precharge transistor N11 and to an input terminal "BDIN" of the bit-line voltage detection circuit 600. A drain terminal of the bit-line precharge transistor N11 is connected to a power supply voltage. The other terminal (a minus terminal, for example) of the comparison circuit 310 is connected to a terminal SAREF of the read circuit 206. An output terminal of the comparison circuit 310 is connected to the data signal input-output circuit 207 via a terminal SAOUT of the read circuit 206, and then outputs the data to an external source.

The bit-line voltage detection circuit 600 is an inverter element including a PMOS transistor P10 and an NMOS transistor N13. A source terminal of the PMOS transistor P10 is connected to the bit-line voltage switching circuit 400 via a terminal "VDDBD" of the bit-line voltage detection circuit 600. A gate terminal of the PMOS transistor P10 is grounded. A drain terminal of the PMOS transistor P10 is connected to the output terminal BDOUT of the bit-line voltage detection circuit 600 and also to a drain terminal of the NMOS transistor N13. A gate terminal of the NMOS transistor N13 is connected to the input terminal BDIN of the bit-line voltage detection circuit 600, and a source terminal of the NMOS transistor N13 is grounded.

The bit-line voltage switching circuit 400 includes switches SW1 and SW2. One terminal of the switch SW1 of the bit-line voltage switching circuit 400 is connected to the output terminal OUT1 of the bit-line control voltage generation circuit 507. One terminal of the switch SW2 is connected to the output terminal OUT2 of the bit-line control voltage generation circuit 507. The other terminal of the switch SW1 and the other terminal of the switch SW2 are connected to each other, and are also connected to the terminal VDDBD of the bit-line voltage detection circuit 600 of the sense amplifier 304.

The bit-line control voltage generation circuit 507 includes the voltage source VPP and the reference current steering element RD15. The voltage source VPP generates the read clamp voltage Vcr represented by Expression 1 and outputs the read clamp voltage Vcr via the output terminal OUT1 of the bit-line control voltage generation circuit 507. One terminal of the reference current steering element RD15 is connected to the voltage source VPP, and the other terminal of the reference current steering element RD15 is connected to the output terminal OUT2 of the bit-line control voltage generation circuit 507. The reference current steering element RD15 generates the cell characteristic determination clamp voltage Vct represented by Expression 2. Here, the cell characteristic determination clamp voltage Vct outputted from the output terminal OUT2 of the bit-line control voltage generation circuit 507 is a voltage reduced from the read clamp voltage Vcr outputted from the output terminal OUT1 by a threshold voltage VF of the reference current steering element RD15.

In the regular read mode of the sense amplifier 304, the bit-line voltage switching circuit 400 sets the switch SW1 to an ON state and the switch SW2 to an OFF state. By doing so, the bit-line voltage switching circuit 400 outputs the read clamp voltage Vcr to the terminal VDDBD of the bit-line voltage detection circuit 600. In the cell characteristic determination mode, the bit-line voltage switching circuit 400 sets the switch SW1 to the OFF state and the switch SW2 to the ON state. By doing so, the bit-line voltage switching circuit 400 outputs the cell characteristic determination clamp voltage Vct to the terminal VDDBD of the bit-line voltage detection circuit 600.

The bit-line voltage detection circuit 600 detects a potential of the bit line using the input terminal BDIN via the terminal BLIN of the sense amplifier 304. Suppose that the potential of the bit line is lower than or equal to the threshold voltage of the bit-line voltage detection circuit 600. In this case, the NMOS transistor N13 enters the OFF state. Then, the voltage supplied by the terminal VDDBD is applied to the gate terminal of the bit-line voltage control transistor N1 and the gate terminal of the bit-line precharge transistor N11 via the output terminal BDOUT. With this, the potential of the bit line is precharged to a voltage reduced from the voltage to be applied to the gate terminal of the bit-line voltage control transistor N1 by the threshold voltage Vtn of the bit-line voltage control transistor N1. When the potential of the bit line exceeds the threshold voltage of the bit-line voltage detection circuit 600, the NMOS transistor N13 enters the ON state. Then, with a decrease in the voltage of the output terminal BDOUT of the bit-line voltage detection circuit 600, the bit-line voltage control transistor N1 and the bit-line precharge transistor N11 enter the OFF states. To be more specific, when the potential of the bit line is lower than or equal to the threshold voltage of the bit-line voltage detection circuit 600, the bit line can be precharged to a predetermined potential at high speed by the bit-line precharge transistor N11.

With this configuration, the voltage to be applied to the bit line is precharged to the predetermined potential by the bit-line precharge transistor N11. Thus, the state of the memory cell can be detected at high speed.

It should be noted that the present invention is not limited to Embodiments described above. Therefore, various changes and modifications can be made without departing from the scope of the present invention.

For example, the connection relationship between the current steering element and the variable resistance element may be turned upside down. Moreover, the connection relationship between the first variable resistance layer and the second variable resistance layer may be turned upside down. Furthermore, the connection relationship between the lower electrode and the upper electrode may be turned upside down.

In Embodiments described above, the nonselected bit lines BL1 and BL3 and the nonselected word lines WL1 and WL3 are brought into the high impedance states. However, the present invention is not limited to this. Each of these lines may be set at a voltage lower than or equal to the voltage applied between the selected bit line BL2 and the selected word line WL2.

The materials of the upper electrode, the lower electrode, the first variable resistance layer, and the second variable resistance layer described in Embodiments above are only examples and, therefore, different materials may be used. For example, the metal oxide layer of the variable resistance element has been described to have a structure where tantalum oxides are stacked. However, the aforementioned advantageous effect according to the present invention is implemented not only in the case of the metal oxide layer comprising the tantalum oxide. It should be obvious that the variable resistance element may have a different structure or comprise a different material as long as the variable resistance element changes a resistance value reversibly between at least two values.

In Embodiments above, the current steering element has been described as a bidirectional current steering element. However, a unidirectional diode may be used. Moreover, the current steering element described in Embodiments above may be a PN diode, a Schottky diode, or a zener diode.

INDUSTRIAL APPLICABILITY

As described thus far, the variable resistance nonvolatile memory device having the cross point structure according to the present invention is useful for implementing a highly-reliable memory by detecting an address of a faulty cell included in a memory cell that employs a current steering element having a bidirectional characteristic and by analyzing the faulty cell.

REFERENCE SIGNS LIST 10, 100 Current steering element
20, 101 Variable resistance element
21 First variable resistance layer
22 Second variable resistance layer
23 Lower electrode
24 Upper electrode
30, 102, 1280 Memory cell
50 Lower line
51 Upper line
200 Variable resistance nonvolatile memory device
201 Main memory unit
202 Memory cell array
203 Word line selection circuit (memory cell selection circuit)
204 Bit line selection circuit (memory cell selection circuit)
205 Write circuit
206 Read circuit
207 Data signal input-output circuit
208 Address signal input circuit
209 Control circuit
300 Sense amplifier
310 Comparison circuit (detection circuit)
400, 401 Bit-line voltage switching circuit
500, 502, 503, 504, 505, 506, 507 Bit-line control voltage generation circuit
600 Bit-line voltage detection circuit (voltage detection circuit)
BL1, BL2, BL3 Bit line
D11, D12, D13, D21, D22, D23, D31, D32, D33 Current steering element
M11, M12, M13, M21, M22, M23, M31, M32, M33 Memory cell
R11, R12, R13, R21, R22, R23, R31, R32, R33 Variable resistance element
WL1, WL2, WL3 Word line

The invention claimed is:

1. A method of inspecting a variable resistance nonvolatile memory device,
the variable resistance nonvolatile memory device including:
a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing at least between a low resistance state and a high resistance state, and the current steering element carrying a current from which the current steering element is assumed to be conducting as a result of an application of a voltage exceeding a predetermined threshold voltage;
a memory cell selection circuit that selects one of the memory cells by selecting at least one of the word lines and at least one of the bit lines; and
a read circuit that reads a resistance state of the selected memory cell by performing voltage application on the selected memory cell so that a first voltage higher than the threshold voltage and a second voltage lower than the threshold voltage are applied to the current steering element of the selected memory cell, and
the method comprising:
determining that the current steering element has a short-circuit fault in the case where a value of a current passing through the current steering element is higher than or equal to a predetermined value, when the resistance state of the memory cell is read by the application of the second voltage; and
determining whether the variable resistance element is in the low resistance state or the high resistance state, when the resistance state of the memory cell is read by the application of the first voltage.

2. The method of inspecting the variable resistance nonvolatile memory device according to claim 1,
wherein the second voltage is lower than the first voltage by the threshold voltage.

3. The method of inspecting the variable resistance nonvolatile memory device according to claim 1, the method further comprising
writing the low resistance state to the memory cell, before the determining that the current steering element has the short-circuit fault,
wherein, when the current having the value higher than or equal to the predetermined value does not pass through the current steering element, the current steering element is determined to be normal.

4. The method of inspecting the variable resistance nonvolatile memory device according to claim 1,
wherein, after the resistance state of the memory cell is read by the application of the second voltage, the resistance state of the memory cell is read by the application of the first voltage.

5. The method of inspecting the variable resistance nonvolatile memory device according to claim 1,
wherein the predetermined value is a maximum value of a current passing through the current steering element when (i) the threshold voltage is applied to the current steering element that is normal and in the low resistance state and (ii) the current steering element is assumed to be in an OFF state.

6. A variable resistance nonvolatile memory device comprising:
a plurality of word lines arranged in parallel to each other in a first plane;
a plurality of bit lines that are arranged in parallel to each other in a second plane parallel to the first plane, and three-dimensionally cross the word lines;

a memory cell array having a plurality of memory cells each including a variable resistance element and a current steering element that are connected in series, each of the memory cells being located at a three-dimensional cross point of one of the word lines and one of the bit lines, the variable resistance element changing at least between a low resistance state and a high resistance state, and the current steering element carrying a current from which the current steering element is assumed to be conducting as a result of an application of a voltage exceeding a predetermined threshold voltage;

a memory cell selection circuit that selects one of the memory cells by selecting at least one of the word lines and at least one of the bit lines; and a read circuit that reads a resistance state of the selected memory cell, wherein the read circuit includes:

a bit-line control voltage generation circuit that (i) generates a first voltage higher than the threshold voltage and a second voltage lower than the threshold voltage and (ii) outputs the first voltage and the second voltage from a first output terminal and a second output terminal, respectively;

a bit-line voltage switching circuit that is connected to the bit-line control voltage generation circuit and switches between the first voltage and the second voltage to provide a corresponding one of the first voltage and the second voltage;

a bit-line voltage steering circuit that has (i) an output terminal connected to the memory cell selection circuit and (ii) a control terminal connected to the bit-line voltage switching circuit; and a detection circuit that detects a current passing through the selected memory cell via the selected word line and the selected bit line as a result of an application of a voltage to the selected bit line, the voltage being determined according to a voltage to be applied to the control terminal of the bit-line voltage steering circuit, wherein, when the resistance state of the memory cell is read by the application of the first voltage, the detection circuit provides (i) a first logic output when the selected memory cell is in the low resistance state and (ii) a second logic output when the selected memory cell is in the high resistance state, and when the resistance state of the memory cell is read by the application of the second voltage and the current steering element of the selected memory cell has a short-circuit fault, the detection circuit provides (i) the first logic output when the variable resistance element is in the low resistance state, and (ii) one of the first logic output and the second logic output when the variable resistance element is in the high resistance state.

7. The variable resistance nonvolatile memory device according to claim 6, wherein the bit-line voltage steering circuit includes an N-channel metal oxide semiconductor (NMOS) transistor, the output terminal of the bit-line voltage steering circuit is one of a source terminal and a drain terminal of the NMOS transistor, and the control terminal of the bit-line voltage steering circuit is a gate terminal of the NMOS transistor.

8. The variable resistance nonvolatile memory device according to claim 6, wherein the second voltage is lower than the first voltage by the threshold voltage.

9. The variable resistance nonvolatile memory device according to claim 6, wherein the second voltage is generated as a partial voltage of the first voltage and is higher than a ground potential used as a reference potential, and the current steering element is connected between the first output terminal and the second output terminal of the bit-line control voltage generation circuit.

10. The variable resistance nonvolatile memory device according to claim 6, wherein the second voltage is generated as a partial voltage of the first voltage and is higher than a ground potential used as a reference potential, a fixed resistance element is connected between the first output terminal and the second output terminal of the bit-line control voltage generation circuit, and a resistance value of the fixed resistance element is set so that a potential difference between the first voltage and the second voltage is equal to the threshold voltage.

11. The variable resistance nonvolatile memory device according to claim 6, wherein the second voltage is generated as a partial voltage of the first voltage and is higher than a ground potential used as a reference potential, and an NMOS transistor and a resistance element are connected in series between the ground potential and the second output terminal of the bit-line control voltage generation circuit, the NMOS transistor having a drain terminal and a gate terminal connected to each other.

12. The variable resistance nonvolatile memory device according to claim 11, wherein the resistance element is formed by a variable resistance element having a same configuration as the variable resistance element included in the memory cell, and is set to one of a low resistance state and a high resistance state.

13. The variable resistance nonvolatile memory device according to claim 11, wherein the resistance element is formed by a fixed resistance element, and a resistance value of the fixed resistance element is set to be between a resistance value of the variable resistance element in the low resistance state and a resistance value of the variable resistance element in the high resistance state.

14. The variable resistance nonvolatile memory device according to claim 6, wherein the second voltage is generated as a partial voltage of the first voltage and is higher than a ground potential used as a reference potential, a fixed resistance element is connected between the ground potential and the second output terminal of the bit-line control voltage generation circuit, and a resistance value of the fixed resistance element is set so that a potential difference between the first voltage and the second voltage is equal to the threshold voltage.

15. The variable resistance nonvolatile memory device according to claim 6, wherein the second voltage is generated as a partial voltage of the first voltage and is higher than a ground potential used as a reference potential, and a current steering element having a same configuration as the current steering element included in the memory cell and a variable resistance element having a same configuration as the variable resistance element included in the memory cell are connected in series between the first output terminal and the second output terminal of the bit-line control voltage generation circuit.

16. The variable resistance nonvolatile memory device according to claim 6,
wherein the bit-line control voltage generation circuit includes a first voltage source generating the first voltage and a second voltage source generating the second voltage.

17. The variable resistance nonvolatile memory device according to claim 6,
wherein the read circuit further includes a voltage detection circuit that detects a voltage of the selected bit line.

* * * * *